(12) United States Patent
Koitz et al.

(10) Patent No.: US 8,603,910 B2
(45) Date of Patent: Dec. 10, 2013

(54) METHOD OF PROCESSING A CONTACT PAD

(75) Inventors: Marco Koitz, Villach Landskron (AT); Guenter Zieger, Villach (AT); Christian Krenn, Viktring (AT); Franz Kleinbichler, Villach (AT); Guenther Zoth, Regensburg (DE); Karl Mayer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 85 days.

(21) Appl. No.: 13/349,682

(22) Filed: Jan. 13, 2012

(65) Prior Publication Data

US 2013/0180945 A1  Jul. 18, 2013

(51) Int. Cl.
 *H01L 21/44* (2006.01)

(52) U.S. Cl.
 USPC ............. 438/612; 438/660; 257/E21.59

(58) Field of Classification Search
 USPC ............................................ 438/661
 See application file for complete search history.

(56) References Cited

U.S. PATENT DOCUMENTS

2003/0013291 A1*  1/2003  Chen et al. ................ 438/613

* cited by examiner

*Primary Examiner* — Cheung Lee

(57) ABSTRACT

In various embodiments, a method of processing a contact pad may include providing a contact pad, a topmost layer of the contact pad containing aluminum or an aluminum alloy, at least part of the topmost layer of the contact pad being exposed; subjecting the contact pad to a thermally activated atmosphere containing water or reactive components of water.

37 Claims, 9 Drawing Sheets

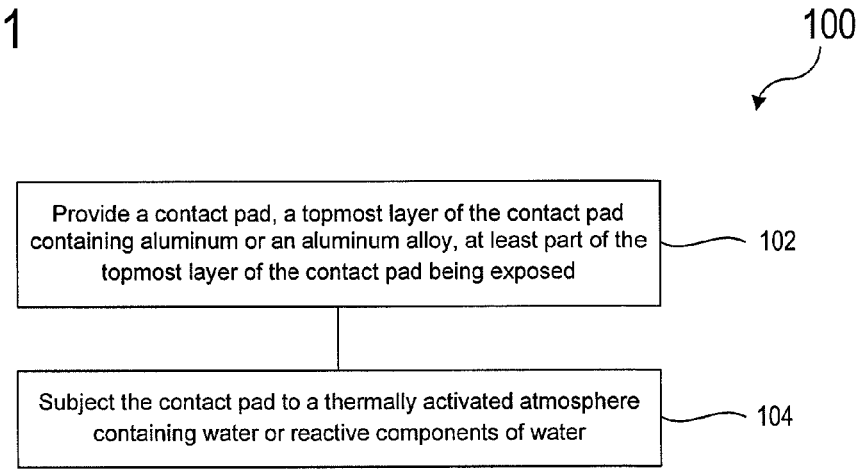
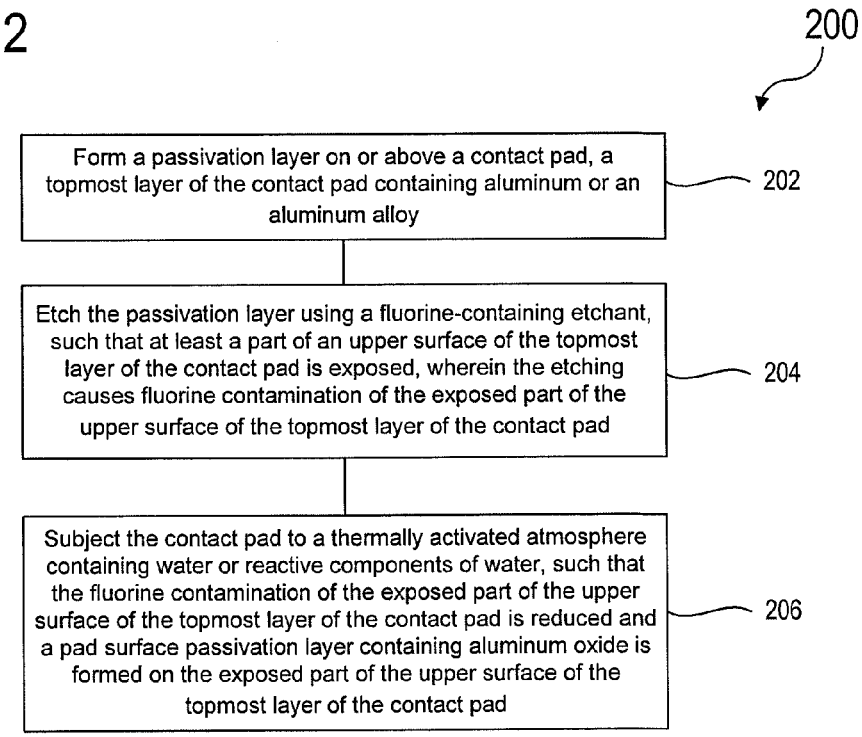

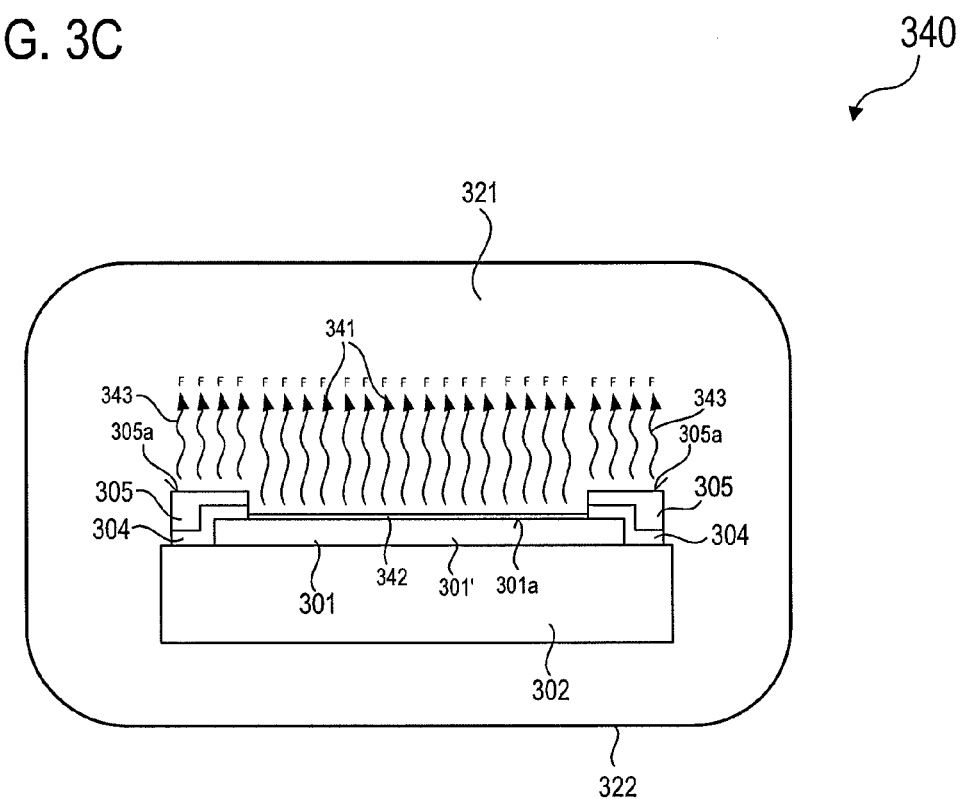

FIG. 7
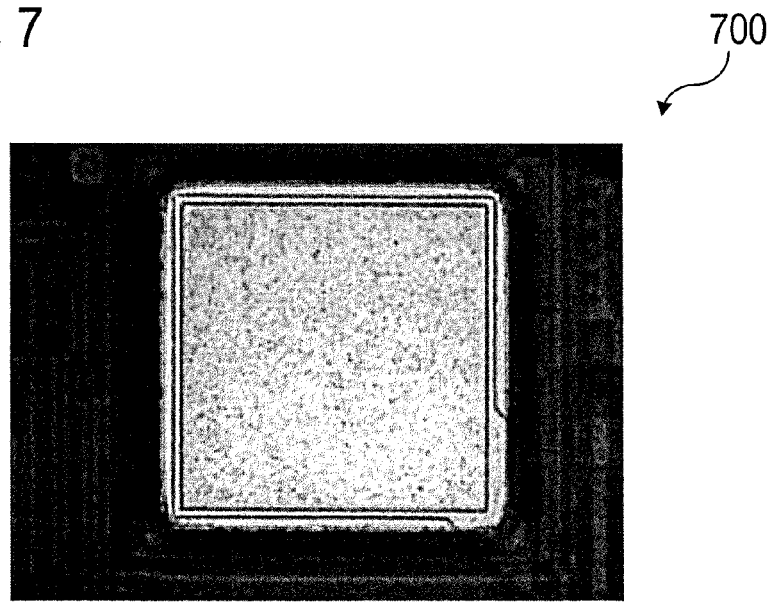
700
FIG. 8
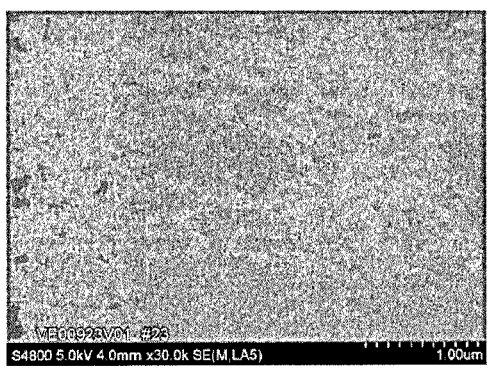
800
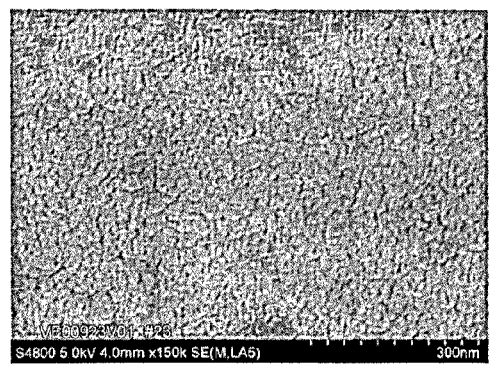
820

FIG. 9
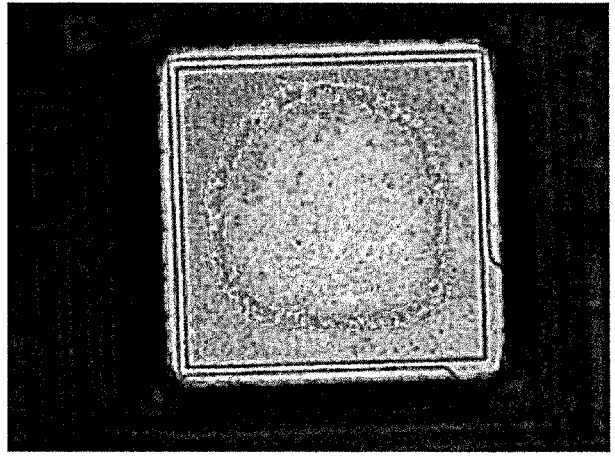
FIG. 10
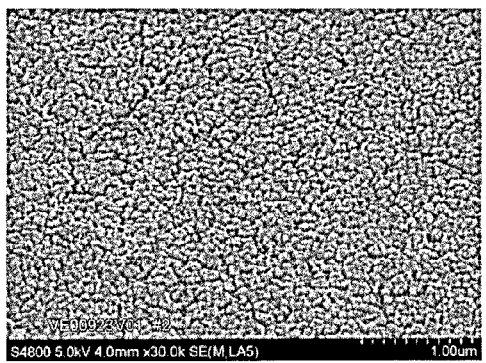
1000
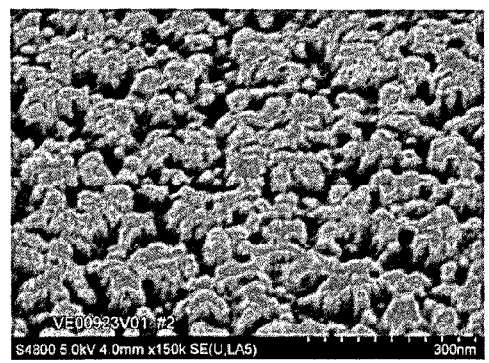
1020

METHOD OF PROCESSING A CONTACT PAD

TECHNICAL FIELD

Various embodiments relate generally to a method of processing a contact pad.

BACKGROUND

In the fabrication of modern semiconductor devices or integrated circuits (ICs), e.g. chips, one or more contact pads (also referred to as bond pads or, short, pads) may commonly be provided to electrically contact the device or circuit to/from the outside. In this context, effective pad treatment processes (also referred to as pad conditioning processes) may be needed to provide defined pad surfaces that may, for example, be insensitive to corrosion by environmental conditions and suitable for further processing such as wafer thinning, backside metallization, wire bonding, wedge bonding, etc.

BRIEF DESCRIPTION OF THE DRAWINGS

In the drawings, like reference signs generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a diagram illustrating a method of processing a contact pad in accordance with an embodiment;

FIG. 2 shows a diagram illustrating a method of processing a contact pad in accordance with an embodiment;

FIGS. 3A to 3C show schematical views illustrating a method of processing a contact pad in accordance with an embodiment;

FIG. 7 shows a photograph of a contact pad that has been subjected to a pad treatment cure (PTC) process in accordance with an embodiment;

FIG. 8 shows SEM micrographs of the surface of a polyimide layer obtained after a PTC process in accordance with an embodiment.

FIG. 9 shows a photograph of a contact pad with discoloration due to fluorine contamination;

FIG. 10 shows SEM micrographs of the surface of a polyimide layer obtained after a conventional pad conditioning process.

DESCRIPTION

Figure 3A:
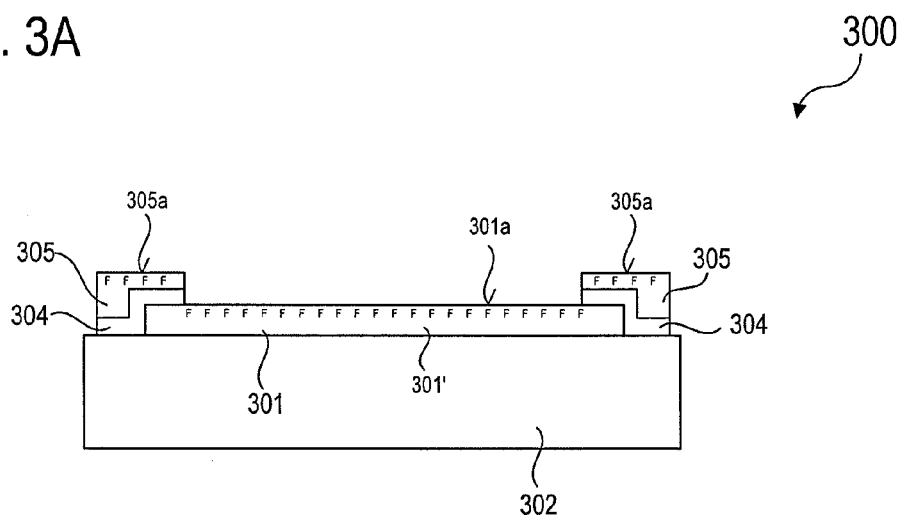

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. The following detailed description therefore is not to be taken in a limiting sense, and the scope of the present invention is defined by the appended claims.

The term "at least one" as used herein may be understood to include any integer number equal to or greater than one, i.e. "one", "two", "three", . . . , etc.

Unless otherwise indicated, the term "a plurality" as used herein may be understood to include any integer number equal to or greater than two, i.e. "two", "three", "four", . . . , etc.

The terms "coupling" or "connection" as used herein may be understood to include a direct "coupling" or direct "connection" as well as an indirect "coupling" or indirect "connection", respectively.

The terms "contact pad", "bond pad" or "pad" as used herein may be understood to include a designated metallization area at the surface of an integrated circuit (IC) element or device (e.g. at the surface of a die or chip) that may be used to electrically contact the IC element/device from/to the outside. This may, for example, include pads that may be electrically contacted using a bonding process such as, for example, a wire bonding process, a wedge bonding process or a ball bonding process, (other bonding processes such as, for example, clip attach may be possible as well). The terms "contact pad", "bond pad" or "pad" may be used interchangeably herein.

The terms "halogen contamination (of a layer or surface)" or "contamination (of a layer or surface) with a halogen or halogens" as used herein may be understood to refer to the presence of a minor and unwanted amount of a halogen or halogens in the layer or at the surface of a layer. For example, "fluorine contamination (of a layer or surface)" or "contamination (of a layer or surface) with fluorine" may be understood to refer to the presence of a minor and unwanted amount of fluorine in the layer or at the surface of a layer. In other words, besides its regular constituents (i.e. the material or materials of the layer) the layer or surface may include a minor amount of halogen contaminants (e.g. fluorine contaminants). The term "halogen contamination" as used herein may, for example, include the presence of chemical compounds in the layer or at the surface that may be the result of a chemical reaction of the halogen or halogens with the material or materials of the layer or surface. For example, the term "fluorine contamination of a layer or surface containing aluminum" as used herein may include the presence of $Al[AlF_6]$ and/or $AlF_3$ in the layer or at the surface. A layer or surface that exhibits halogen contamination may also be referred to herein as a halogen-contaminated layer or surface. For example, a layer or surface that exhibits fluorine contamination may also be referred to herein as a fluorine-contaminated layer or surface.

Unless otherwise indicated herein, the terms "gas", "gaseous" and "substance in the gas phase" as used herein may be understood to include neutral gases or substances in the gas phase as well as plasmas. For example, the term "oxygen gas" or "oxygen as a gas" as used herein may be understood to include neutral oxygen gas as well as a plasma containing oxygen, in other words oxygen plasma. Similarly, the term "water vapor" as used herein may be understood to include neutral water vapor as well as a plasma containing water vapor, in other words water vapor plasma.

The term "atmosphere" or "gas atmosphere" as used herein may be understood to refer to a gaseous medium containing at least one gas or substance in the gas phase that may, for example, be located in a closed system, for example in a process chamber. A gaseous medium containing a plurality of gases and/or substances in the gas phase may also be referred to herein as a gas mixture.

The expression "atmosphere containing A" as used herein may, for example, be understood to refer to a gaseous medium that contains at least "A" (where "A" may be a gas or a substance in the gas phase) and optionally one or more additional gases and/or substances in the gas phase. For example, the expression "atmosphere containing water" as used herein may be understood to refer to a gaseous medium that contains at least water ($H_2O$) in the gas phase (water vapor, sometimes also referred to as aqueous vapor), and optionally one or more additional gases and/or substances in the gas phase. Similarly, the expression "atmosphere containing water and oxygen" as used herein may be understood to refer to a gaseous medium that contains at least water ($H_2O$) in the gas phase (water vapor) and oxygen ($O_2$) as a gas, and optionally one or more additional gases and/or substances in the gas phase. Similarly, the expression "atmosphere containing water, oxygen and hydrogen" as used herein may be understood to refer to a gaseous medium that contains at least water ($H_2O$) in the gas phase (water vapor), oxygen ($O_2$) as a gas and hydrogen ($H_2$) as a gas, and optionally one or more additional gases and/or substances in the gas phase. Herein, the terms "atmosphere" and "gas atmosphere" may be used interchangeably.

The expression "thermally activated atmosphere" as used herein may be understood to refer to an atmosphere that may have a temperature that may be significantly higher than room temperature (e.g. several tens to several hundreds of degrees Celsius higher than room temperature), such that reactivity or reaction rate of at least one of the atmosphere's components may be significantly increased compared to reactivity or reaction rate at room temperature (e.g. increase in reaction rate by a factor of at least ten compared to reaction rate at room temperature).

The term "reactive components of water" as used herein may be understood to refer to hydrogen as a gas ($H_2$) and oxygen as a gas ($O_2$).

In the fabrication of modern semiconductor devices or integrated circuits (ICs), e.g. chips, one or more contact pads may commonly be provided to electrically contact the device or circuit to/from the outside. In this context, effective pad treatment processes (also referred to as pad conditioning processes) may be needed to provide defined pad surfaces that may, for example, be insensitive to corrosion by environmental conditions and suitable for further processing such as wafer thinning, backside metallization, wire bonding, wedge bonding, etc.

For example, discolored, especially halogen (e.g. fluorine) contaminated bond pad surfaces may lead to various non-conformances such as optical discolorations, non-stick on pad deviations, weak bond shear test results or potentially degraded electrical contact resistance properties.

FIG. 9 shows a photograph of a contact pad 900, which exhibits discoloration due to fluorine contamination of the pad surface. For example for the above-given reasons, it may be desirable to reduce such contaminations of the pad surface.

Today, final pad definition processes (in other words, processes applied to define or form the pads) frequently use halogen-containing etch chemistry (e.g., fluorine-containing etch chemistry), e.g. when etching a passivation layer over the pad to expose the pad surface (so-called pad opening process). The passivation layer etching may cause contamination of the exposed pad surface, in particular halogen contamination (in other words, contamination of the pad surface with halogens or reaction products containing halogens), e.g. fluorine contamination in case of fluorine-containing etch chemistry, but possibly also organic contaminations (in other words, contamination with organic materials, e.g. hydrocarbons ($C_nH_m$)).

In order to produce pads of high quality, pad treatment processes may be applied to reduce the contamination of the pad surface. Examples of pad treatment processes that are currently used to reduce pad surface contamination such as fluorine and organic materials include plasma enhanced processes using Ar (argon), $Ar/O_2$ (argon/oxygen) or TMAH (tetra methyl ammonium hydroxide) treatment of the pad surface.

By means of $Ar/O_2$ plasma pad treatment, fluorine contamination of a pad may, for example be reduced by about 50%. However, during the $Ar/O_2$ process the surface of a chip passivation (e.g. of a polyimide layer) may become rough, as is shown in FIG. 10, which shows two SEM (scanning electron microscopy) micrographs 1000 and 1020 of the surface of a polyimide layer obtained by an $Ar/O_2$ pad treatment process, the first micrograph 1000 having a magnification factor of 30,000 and the second micrograph 1020 having a magnification factor of 150,000. The rough surface may, for example, cause organic residues (e.g. glue residues) when post processes are applied (e.g. foil demounting process during a wafer thinning process). Such effect may require additional optical inspection to assure a stable quality and may lead to yield loss.

By means of a TMAH process, fluorine contamination of a pad may typically be reduced by about 30%. However, the TMAH process may strongly depend on the surface condition after the pad opening plasma process and may therefore not be applicable in any case. Furthermore, in case of aluminum pads, the TMAH process may inhibit growth of a nanometer-thin $Al_2O_3$ (aluminum oxide) pad surface passivation layer.

FIG. 1 shows a diagram 100 illustrating a method of processing a contact pad in accordance with an embodiment.

In 102, a contact pad may be provided. A topmost layer of the contact pad may contain aluminum or an aluminum alloy. At least part of the topmost layer (e.g. of an upper surface of the topmost layer) of the contact pad may be exposed. In accordance with some embodiments, the exposed part of the topmost layer of the contact pad may have a halogen contamination. In other words, the exposed part of the topmost layer (e.g. of the upper surface of the topmost layer) of the contact pad may be halogen-contaminated.

In 104, the contact pad (e.g. the exposed part of the upper surface of the topmost layer of the contact pad) may be subjected (in other words, exposed) to a thermally activated atmosphere containing water or reactive components of water. In accordance with some embodiments, the halogen contamination of the exposed part of the topmost layer (e.g. of the upper surface of the topmost layer) of the contact pad may be reduced by means of subjecting the contact pad to the thermally activated atmosphere. In accordance with some embodiments, a pad surface passivation layer may be formed on the exposed part of the topmost layer (e.g. of the upper surface of the topmost layer) of the contact pad by means of subjecting the contact pad to the thermally activated atmosphere.

In other words, in accordance with some embodiments the surface of the contact pad may be treated with a thermally activated atmosphere containing water or reactive components of water such that halogen surface contaminants (e.g. fluorine contaminants) may be reduced or substantially removed from the pad surface, and a pad surface passivation layer may be grown on the pad surface. The pad surface passivation layer may include or may consist of aluminum oxide ($Al_2O_3$). For example, in accordance with various embodiments, the pad surface passivation layer may be an aluminum oxide layer. The treatment of the pad surface with the thermally activated atmosphere as described herein in connection with various embodiments may also be referred to as pad treatment cure (PTC) or pad treatment cure (PTC) process.

In accordance with an embodiment, the contact pad may include a single layer (herein also referred to as contact pad layer). In this case, the term "topmost layer of the contact pad" may refer to that layer. Alternatively, the contact pad may include a layer stack (herein also referred to as contact pad layer stack) including a plurality of sublayers. In this case, the term "topmost layer of the contact pad" may refer to the topmost sublayer of the layer stack.

The topmost layer of the contact pad may also be referred to herein as surface layer of the pad or pad surface layer.

In accordance with an embodiment, the topmost layer of the contact pad may include or may consist of at least one of the following materials: aluminum (Al), aluminum silicon (AlSi), aluminium copper (AlCu), aluminum silicon copper (AlSiCu). Alternatively or in addition, the topmost layer of the contact pad may include or may consist of other materials containing aluminum.

In case the contact pad includes a layer stack including a plurality of sublayers, at least one of the sublayers below the topmost sublayer of the layer stack may include or may consist of at least one of the following materials: titanium (Ti), tungsten (W), copper (Cu), molybdenum (Mo), nickel (Ni), a silicide, tantalum (Ta), vanadium (V), silicon (Si). Alternatively or in addition, one or more sublayers below the topmost sublayer of the layer stack may include or may consist of other materials.

Various temperatures or temperature ramp-procedures may be applied when subjecting the contact pad (e.g. the exposed pad surface) to the thermally activated atmosphere. For example, various temperature profiles up to the melting point of aluminum (approximately 660° C.) may be applied.

For example, in accordance with some embodiments, a temperature of the thermally activated atmosphere may be in the range from about 50° C. to about 500° C., for example in the range from about 100° C. to about 400° C. in accordance with some embodiments, for example in the range from about 200° C. to about 300° C. in accordance with some embodiments, for example about 250° C. in accordance with an embodiment. In accordance with other embodiments, the temperature may have other values.

In accordance with some embodiments, subjecting the contact pad (e.g. the exposed part of the upper surface of the topmost layer of the contact pad) to the thermally activated atmosphere may be carried out for a time period in the range from about several seconds (for example in (but not restricted to) embodiments using rapid thermal processing (RTP)) to about several days (for example in (but not restricted to) embodiments using hot storage), for example for a time period in the range from about 5 seconds to about 5 days in accordance with some embodiments, for example for a time period in the range from about 30 min to about 3 h in accordance with some embodiments, for example for a time period in the range from about 90 min to about 2.5 h in some embodiments, for example for a time period of about 2 h in accordance with an embodiment. For example in (but not restricted to) embodiments where RTP is used, the time period may, for example, be in the range from about 5 seconds to about 10 seconds (ramp up to e.g. 200° C. and ramp down), or (with plateau time) in the range from about 5 seconds to about 30 seconds in accordance with some embodiments (e.g. in case the RTP peak temperature is about 200° C.), or in the range from about 10 seconds to about 20 seconds in accordance with some embodiments (e.g. in case the RTP peak temperature is about 300° C.). For example in (but not restricted to) embodiments where hot storage is used, the time period may, for example, be in the range from about about 1 to 5 days in accordance with some embodiments, for example in the range from about 2 to 4 days in accordance with some embodiments, for example about 3 days in accordance with some embodiments. In accordance with other embodiments, the time period may have other values.

In general, various temperature budgets may be applied when subjecting the contact pad (e.g. the exposed pad surface) to the thermally activated atmosphere.

In accordance with an embodiment, the thermally activated atmosphere may contain water (or water vapor (H2O vapor)).

In accordance with an embodiment, the water (water vapor) may be present in the form of a plasma. In other words, the thermally activated atmosphere may include a water vapor plasma.

In accordance with an embodiment, the water (water vapor) in the thermally activated atmosphere may have a partial pressure that may have any value above zero and below the critical pressure of water (i.e. the pressure at the vapor-liquid critical point of water), which is about 220 bar. For example, in accordance with some embodiments the partial pressure may be in the range from a few millibars (mbar) to a few hundred millibars, for example about 50 mbar in some embodiments, for example in (but not restricted to) embodiments where the thermally activated atmosphere has atmospheric pressure (i.e. a pressure of about 1013 mbar). In accordance with other embodiments, the partial pressure may have other values.

In accordance with an embodiment, the thermally activated atmosphere may contain hydrogen (i.e. $H_2$ gas).

In accordance with an embodiment, the hydrogen may be present in the form of a plasma. In other words, the thermally activated atmosphere may include a hydrogen plasma.

In accordance with an embodiment, the hydrogen in the thermally activated atmosphere may have a partial pressure in the range from about 0 to about 1000 mbar, e.g. in the range from about 0 to about 993 mbar, for example in (but not restricted to) embodiments where the thermally activated atmosphere has atmospheric pressure (i.e. a pressure of about 1013 mbar). In accordance with other embodiments, the partial pressure may have other values.

In accordance with an embodiment, the thermally activated atmosphere may contain oxygen (i.e. $O_2$ gas).

In accordance with an embodiment, the oxygen may be present in the form of a plasma. In other words, the thermally activated atmosphere may include an oxygen plasma.

In accordance with an embodiment, the oxygen in the thermally activated atmosphere may have a partial pressure in the range from about 0 to about 1000 mbar, e.g. in the range from about 0 to about 993 mbar, for example in (but not restricted to) embodiments where the thermally activated atmosphere has atmospheric pressure (i.e. a pressure of about 1013 mbar). In accordance with other embodiments, the partial pressure may have other values.

In accordance with an embodiment, the thermally activated atmosphere may contain water ($H_2O$) and oxygen as a gas ($O_2$).

In accordance with an embodiment, the thermally activated atmosphere may contain hydrogen as a gas ($H_2$) and oxygen as a gas ($O_2$).

In accordance with an embodiment, the thermally activated atmosphere may contain water ($H_2O$), oxygen as a gas ($O_2$) and hydrogen as a gas ($H_2$).

In accordance with various embodiments and as described herein, various water ($H_2O$) and/or oxygen ($O_2$) and/or hydrogen ($H_2$) containing gas mixtures and various pressure conditions may be used for the thermally activated atmosphere. Besides water and/or oxygen and/or hydrogen, the thermally activated atmosphere may contain additional gases and/or gaseous substances. For example, in accordance with an embodiment, also natural atmosphere ("air") may be used. In accordance with various embodiments, the thermally activated atmosphere may have atmospheric pressure (i.e. a pressure of about 1013 mbar). Alternatively, the pressure of the thermally activated atmosphere may have a different value.

The partial pressures of the individual components of the thermally activated atmosphere may, for example, be set as described above. In this context, it should be noted that in embodiments where the thermally activated atmosphere contains both oxygen and hydrogen as a gas, the respective partial pressures of the two gases may be set in such a way that occurrence of an (explosive) oxyhydrogen ("Knallgas") mixture may be avoided.

Furthermore, in accordance with various embodiments and as described herein various temperature profiles up to the melting point of aluminum may be used for the thermally activated atmosphere.

Figure 3B:
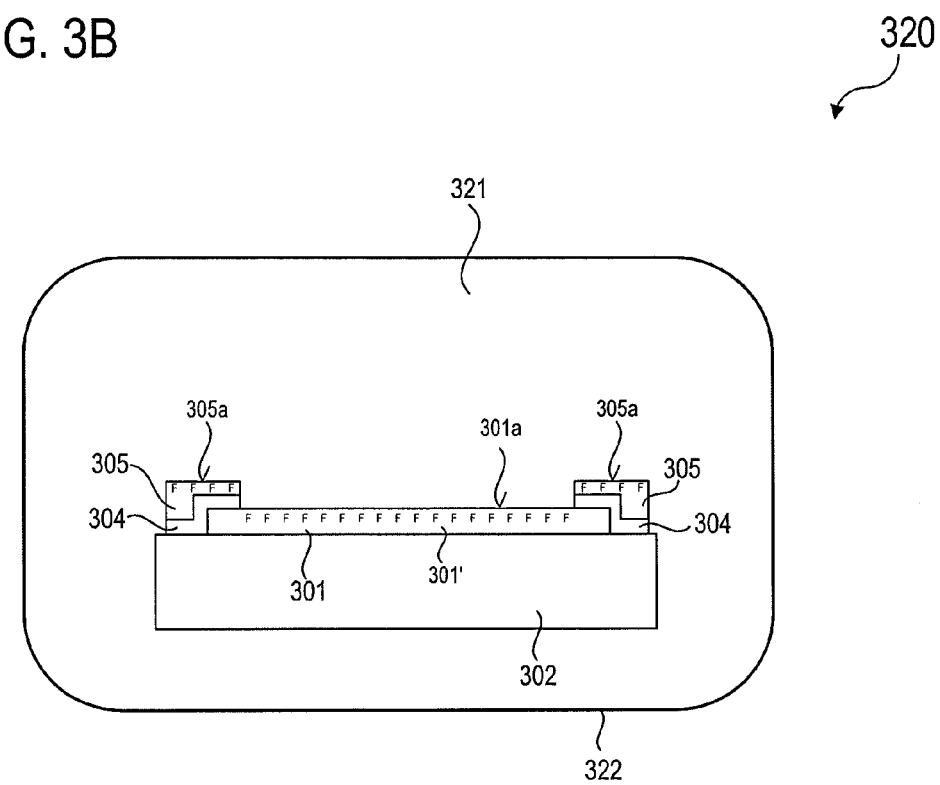

In accordance with an embodiment, subjecting the contact pad (e.g. the exposed part of the upper surface of the topmost layer of the contact pad) to the thermally activated atmosphere may be effected in a process chamber (see e.g. FIG. 3B). To this end, the contact pad (or a substrate (e.g. a wafer), on or above which the contact pad may be formed) may be placed in the process chamber.

The process chamber may, for example, be configured to generate and/or maintain the thermally activated atmosphere (e.g. with respect to gas composition, partial pressures of the components, temperature of the atmosphere, etc.). In other words, the process chamber may be configured to provide or set and/or control the processing conditions used for the pad treatment cure, such as gas mixtures, pressure conditions, temperature budget and/or profiles (e.g. temperature ramp-procedures), etc. For example, in accordance with some embodiments, the process chamber may include one or more gas inlets to supply the individual components of the atmosphere (e.g. water vapor (moisture) and/or oxygen and/or hydrogen, and possibly additional gases or gaseous substances), and/or heating equipment to achieve the desired temperatures or temperature profiles. Furthermore, for example in case that one or more components of the thermally activated atmosphere are applied in the form of a plasma (e.g. water vapor plasma, oxygen plasma, hydrogen plasma) the process chamber may, for example, be configured to generate and/or maintain the respective plasma or plasmas in accordance with some embodiments.

In accordance with some embodiments, the process chamber may include or may be configured as an oven. In general, any suitable type of oven may be used as process chamber. For example, a semiconductor standard oven equipment such as, for example, a horizontal oven may be used in accordance with an embodiment.

In accordance with other embodiments, other suitable types of process chambers may be used.

Thus, in accordance with various embodiments, the thermally activated atmosphere may, for example, be installed on a standard semiconductor oven equipment or simply by heating in the conditions (e.g. gas composition of the atmosphere, partial pressures, temperatures, etc.) described herein. For example, in accordance with some embodiments, the PTC process may be effected on a heat plate, or using RTP (Rapid Thermal Processing), or using hot storage.

In accordance with some embodiments, providing the contact pad may include: forming a contact pad layer or layer stack on or above a substrate, the contact pad layer or layer stack including at least the topmost layer of the contact pad containing aluminum or an aluminum alloy; forming a passivation layer on or above the contact pad layer or layer stack; etching the passivation layer using at least one halogen-containing etchant, such that at least part of the topmost layer (e.g. part of the upper surface of the topmost layer) of the contact pad is exposed. The etching may cause the halogen contamination of the exposed part of the topmost layer (e.g. of the upper surface of the topmost layer) of the contact pad.

The substrate may, for example, be any suitable substrate used for semiconductor device or integrated circuit (IC) fabrication. For example, in accordance with various embodiments, the substrate may be a semiconductor substrate, for example a substrate based on silicon such as e.g. a silicon bulk substrate or a silicon-on-insulator (SOI) substrate; alternatively, other types of substrates and/or other suitable semiconductor materials, including semiconductor compound materials, may be used. In accordance with some embodiments, the substrate may, for example, be a wafer or may be part of a wafer.

In accordance some embodiments, the substrate may, for example, include one or more electronic elements (e.g. transistors, diodes, etc.), e.g. one or more integrated circuits (IC) including one or more circuit elements. In accordance with an embodiment, the substrate may include suitable wiring (e.g. one or more conductive lines or traces, vias, plugs, etc.) that may serve to realize an electrical connection between the electronic element or elements to the at least one contact pad. In accordance with an embodiment, the wiring may, for example, include one or more metallization levels (e.g. metal 1 (M1), metal 2 (M2), metal 3 (M3), . . . , etc.). In accordance with an embodiment, the substrate may, for example, further include suitable electric insulation (e.g. one or more electrically insulating layers, e.g. inter-level dielectric (ILD) or inter-metal dielectric (IMD) layers, etc.) to electrically insulate, for example, different metallization levels from one another, or different conductive lines in the same metallization level.

Figure 4A:
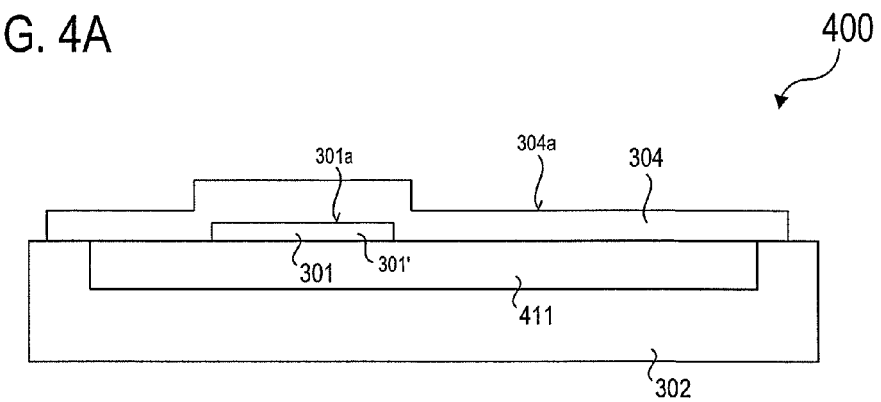
FIGS. 4A to 4G show schematical views illustrating a method of processing a contact pad in accordance with an embodiment.

In accordance with an embodiment, the contact pad layer or layer stack may, for example, be formed on or above an active area of the substrate (see e.g. FIG. 4A).

In accordance with an embodiment, the contact pad layer or one or more (e.g. all) sublayers of the contact pad layer stack, including the topmost layer of the contact pad, may, for example, be formed using a suitable deposition process such as, for example, a plating process. Alternatively, other suitable deposition processes such as, for example, thermal spray coating (e.g. combustion torch, electric arc, plasma sprays), vapor deposition (e.g. ion plating, ion implantation, sputtering and sputter deposition, laser surface alloying), chemical vapor deposition (CVD), printing techniques, lamination, oxidation, or others, may be used.

In accordance with an embodiment, the passivation layer may be configured as a single layer. Alternatively, the passivation layer may be configured as a passivation layer stack including a plurality of sublayers. A passivation layer stack including a plurality of sublayers may also be referred to as a sandwich passivation.

In accordance with an embodiment, the passivation layer, or at least one of the sublayers of the passivation layer stack, may include or may be made of an oxide material (for example, a silicon oxide material such as $SiO_2$, $Si_xO_y$ or $Si_xO_y$:H), a nitride material (for example, a silicon nitride material such as $Si_3N_4$, $Si_xN_y$ or $Si_xN_y$:H), an oxynitride material (for example, a silicon oxynitride material such as $Si_xO_yN_z$ or $Si_xO_yN_z$:H), or a carbide material (for example, a silicon carbide material such as oxygen doped silicon carbide (SiCOH)). Alternatively or in addition, the passivation layer, or at least one of the sublayers of the passivation layer stack, may include or may be made of other suitable materials such as, for example, amorphous hydrogenated carbon (a-C:H), $Al_xO_y$, a metal, or others.

In accordance with an embodiment, the passivation layer may be formed using a deposition process. For example, a chemical vapor deposition (CVD) process may be used as the deposition process in accordance with an embodiment. Alternatively, other suitable deposition processes may be used, depending, for example, on the material or materials of the passivation layer.

The passivation layer or passivation layer stack may have a suitable layer thickness to provide e.g. for sufficient mechanical and/or chemical protection of a chip surface. For example, the layer thickness may be in the nanometer to micrometer range, for example in the range from about a few tens of nanometers to about a few hundred micrometers in accordance with some embodiments, for example in the range from about 20 nm to about 10 µm in accordance with some embodiments, e.g in the range from about 40 nm to about 1.6 µm in accordance with some embodiments, however other values of the thickness may be possible as well in accordance with other embodiments.

In accordance with an embodiment, the halogen-containing etchant may include a fluorine-containing etchant. In other words, a fluorine based etch chemistry may be used in accordance with an embodiment. In this case, the halogen contamination of the upper surface of the topmost layer of the contact pad may include or may be a fluorine contamination, in other words, a surface contamination with fluorine.

In accordance with an embodiment, the fluorine-containing etchant may include or may be a fluorinated etch gas such as, for example, carbon tetrafluoride ($CF_4$), fluoroform ($CHF_3$), nitrogen trifluoride ($NF_3$), sulfur hexafluoride ($SF_6$). Alternatively or in addition, other fluorinated etch gases may be used.

In accordance with an embodiment, etching the passivation layer may be effected using a plasma etch process. In this case, the etchant or etchants used for the etch process may be present in the form of a plasma. As an example, if carbon tetrafluoride ($CF_4$) gas is used as etchant in the plasma etch process, it may be present as $CF_4$ plasma. The etchant or etchants, e.g. etch gases, used in a plasma etch process may also be referred to as plasma etchants.

In accordance with an embodiment, subjecting the contact pad (e.g. the exposed part of the upper surface of the topmost layer of the contact pad) to the thermally activated atmosphere may be effected in a processing step that directly follows etching the passivation layer. In other words, subjecting the exposed part of the upper surface of the topmost layer of the contact pad to the thermally activated atmosphere may be effected directly after a pad opening etch. In this context, it has to be noted that, in accordance with some embodiments, etching the passivation layer and subjecting the contact pad to the thermally activated atmosphere may be carried out in different process chambers. For example, in accordance with some embodiments etching the passivation layer may be carried out in a process chamber adapted for etching (e.g. plasma etching) while subjecting the contact pad to the thermally activated atmosphere may be carried out in an oven. Therefore, the term "directly after a pad opening etch" may be understood to include also implementations, where, after etching the passivation layer and before subjecting the contact pad to the thermally activated atmosphere, the contact pad (or a substrate (e.g. wafer), on or above which the contact pad may be disposed) may be first transferred from the process chamber, in which the etching of the passivation layer has been carried out, to another process chamber (e.g. oven), in which the thermally activated atmosphere will be generated and/or applied.

In accordance with an embodiment, the thermally activated atmosphere may include a plasma. In other words, one or more components of the thermally activated atmosphere (e.g. the water and/or the reactive components of water) may be present in the form of a plasma.

Figure 4B:
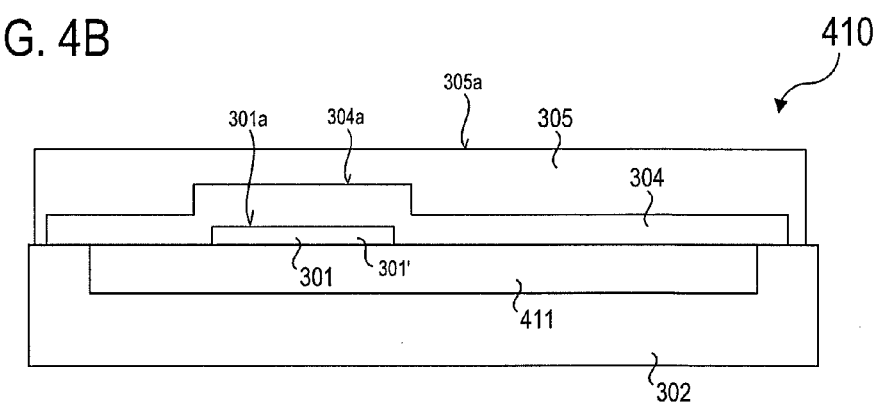

In accordance with an embodiment, before etching the passivation layer, an adhesion or scratch protection layer may be formed on or above the passivation layer (see e.g. FIG. 4B). The adhesion or scratch protection layer may be patterned such that at least a part of the passivation layer located on or above the contact pad may be exposed, wherein etching the passivation layer may include etching the exposed part of the passivation layer. The patterned adhesion or scratch protection layer may, for example, be used as a masking layer when etching the passivation layer.

In accordance with some embodiments, the adhesion or scratch protection layer may, for example, serve to facilitate or increase adhesion to/of a chip packaging material (e.g. mold compound) and/or to protect underlying layers or elements from damages through scratching.

In accordance with an embodiment, the adhesion or scratch protection layer may include or may consist of an imide material, for example a photoimide or polyimide material in accordance with some embodiments. In accordance with alternative embodiments, in principle, any material that may be structured or patterned by means of a photolithographical process, or any material that may, for example, resist a plasma etching process, may be used for the adhesion or scratch protection layer. For example, other suitable resist materials may be used.

In accordance with various embodiments, the adhesion or scratch protection layer may also serve as passivation (e.g. polyimide passivation). Thus, the adhesion or scratch protection layer may also be referred to as a (second) passivation layer in accordance with various embodiments.

In accordance with an embodiment, forming the adhesion or scratch protection layer on or above the passivation layer may be achieved by means of a suitable deposition process. For example, a spin coating process may be used as deposition process in accordance with an embodiment, however other suitable deposition processes such as, for example, printing, laminating, chemical vapor depostion (CVD), or others, may be used in accordance with other embodiments.

The adhesion or scratch protection layer may, for example, be formed to have a layer thickness in the nanometer to micrometer range, for example in the range from several nanometers to several hundred micrometers in accordance with some embodiments, for example in the range from about 1 µm to about 50 µm in accordance with some embodiments, for example in the range from about 3 µm to about 20 µm in accordance with some embodiments, however other values of the thickness may be possible as well in accordance with other embodiments.

In accordance with an embodiment, patterning the adhesion or scratch protection layer may, for example, be achieved by means of a lithographical process (including, for example, exposure (e.g. UV exposure) of the adhesion or scratch protection layer (e.g. photosensitive polyimide layer) using a photolithographical mask, and development of the exposed layer). Alternatively, other suitable processes may be used to pattern the adhesion or scratch protection layer in accordance with other embodiments.

In accordance with an embodiment, the patterned adhesion or scratch protection layer (e.g. exposed and developed polyimide layer) may be cured before etching the passivation layer. The term "curing" as used herein may be understood to include the toughening or hardening of the material or materials of a layer, which may be achieved by a specific treatment of that layer. For example, in case of an adhesion or scratch protection layer including or consisting of a polymer material such as polyimide, curing (i.e. toughening or hardening) of the adhesion or scratch protection layer may refer to the cross-linking of polymer chains that may be brought about, for example, by chemical additives, exposure to UV radiation, heat, electron beam, etc.

In accordance with various embodiments, the pad surface passivation layer (for example, the aluminum oxide layer) that may be formed by subjecting the contact pad (e.g. the exposed part of the upper surface of the topmost layer of the contact pad) to the thermally activated atmosphere may have a layer thickness in the nanometer range, for example a layer thickness of several nanometers, for example a layer thickness equal to or greater than about 2 nm in accordance with some embodiments, for example a layer thickness equal to or greater than about 4 nm in accordance with some embodiments, e.g. about 5 nm in accordance with an embodiment. However, in accordance with other embodiments, other values of the layer thickness may be possible as well.

In principle, a pad surface passivation layer of any desired layer thickness may be obtained. The particular value of the layer thickness and/or the time needed to grow a pad surface passivation layer with such thickness may, for example, be controlled by one or more process parameters such as, for example, components present in the thermally activated atmosphere (e.g. $H_2O$, $O_2$, $H_2$) and their respective partial pressures, temperature and/or temperature profile, reaction time (corresponding, for example, to the time duration of applying the thermally activated atmosphere), degree of halogen (e.g. fluorine) contamination of the pad surface, etc.

FIG. 2 shows a diagram 200 illustrating a method of processing a contact pad in accordance with an embodiment.

In 202, a passivation layer may be formed on or above a contact pad, a topmost layer of the contact pad containing aluminum or an aluminum alloy.

The contact pad and/or the topmost layer of the contact pad may, for example, be further configured in accordance with one or more embodiments described herein.

The passivation layer may, for example, be formed and/or further configured in accordance with one or more embodiments described herein.

In 204, the passivation layer may be etched using a fluorine-containing etchant, such that at least a part of an upper surface of the topmost layer of the contact pad is exposed, wherein the etching causes fluorine contamination of the exposed part of the upper surface of the topmost layer of the contact pad.

Etching of the passivation layer may, for example, be carried out in accordance with one or more embodiments described herein.

The fluorine-containing etchant may, for example, be further configured in accordance with one or more embodiments described herein.

In 206, the contact pad (e.g. the exposed part of the upper surface of the topmost layer of the contact pad) may be subjected (in other words, exposed) to a thermally activated atmosphere containing water or reactive components of water, such that the fluorine contamination of the exposed part of the upper surface of the topmost layer of the contact pad is reduced and a pad surface passivation layer containing aluminum oxide is formed on the exposed part of the upper surface of the topmost layer of the contact pad.

The thermally activated atmosphere may, for example, be further configured in accordance with one or more embodiments described herein.

Subjecting the contact pad (e.g. the exposed part of the upper surface of the topmost layer of the contact pad) to the thermally activated atmosphere may, for example, be carried out in accordance with one or more embodiments described herein. Treatment of the pad surface with the thermally activated atmosphere as described herein in connection with various embodiments may also be referred to as pad treatment cure (PTC) or pad treatment cure (PTC) process.

The pad surface passivation layer may, for example, be further configured in accordance with one or more embodiments described herein.

FIGS. 3A to 3C show schematical views illustrating a method of processing a contact pad in accordance with an embodiment.

FIG. 3A shows, in a view 300, that a contact pad 301 may be provided.

The contact pad 301 may, for example, be configured in accordance with one or more embodiments described herein. In accordance with an embodiment, the contact pad 301 may, for example, be disposed on or above a substrate 302, as shown. The substrate 302 may, for example, be configured in accordance with one or more embodiments described herein. For example, in accordance with an embodiment the substrate 302 may be a semiconductor substrate such as, for example, a silicon substrate (alternatively other types of substrates may be used). For example, the substrate 302 may be a silicon wafer or part of a silicon wafer in accordance with an embodiment, alternatively the substrate 302 may be configured differently.

In addition to the contact pad 301, additional contact pads (not shown) may be disposed on or above the substrate 302 in accordance with some embodiments. The additional contact pads may be configured in a similar or the same manner as described in connection with the contact pad 301 and may be processed in a similar or the same manner as described in connection with the contact pad 301 in accordance with some embodiments.

In accordance with an embodiment, the contact pad 301 may include a single layer 301', as shown. Alternatively, the contact pad 301 may include a layer stack including a plurality of sublayers.

A topmost layer of the contact pad 301 (i.e. the single layer 301' of the contact pad 301 in the embodiment shown; alternatively a topmost sublayer of a plurality of sublayers of a contact pad layer stack) may contain aluminum (Al) or an aluminum alloy such as, for example, AlCu, AlSi or AlSiCu (alternatively, other aluminum containing alloys).

At least part of an upper surface 301a of the topmost layer 301' of the contact pad 301 may be exposed (in other words, uncovered), as shown. For example, in accordance with some embodiments parts of the contact pad 301, e.g. sidewalls of the contact pad 301 and peripheral regions of the upper surface 301a of the topmost layer 301' of the contact pad 301, may be covered, for example by a passivation layer 304 and (in accordance with some embodiments) an adhesion or protection layer 305 disposed on or above the passivation layer 304. In accordance with some embodiments, the entire upper surface 301a of the topmost layer 301' of the contact pad 301 may be exposed.

The exposed part of the upper surface 301a of the topmost layer 301' of the contact pad 301 may have a fluorine contamination, as indicated in FIG. 3A by the "F"s located in layer 301'. In other words, at least part of the upper surface 301a of the topmost layer 301' of the contact pad 301 may be fluorine-contaminated. In still other words, a minor amount of fluorine contaminants may be present at the upper surface 301a of the topmost layer 301' and/or in the topmost layer 301' of the contact pad 301. The fluorine contaminants may, for example, be reaction products of fluorine with aluminum (of the topmost layer 301' of the contact pad 301) such as e.g. $AlF_3$ or $Al[AlF_6]$.

In accordance with some embodiments, the fluorine contamination "F" may have been caused, for example, by a pad opening etch using a fluorine-containing etchant (e.g. a fluorinated etch gas such as, for example, $CF_4$), in which the passivation layer 304 (e.g. an oxide layer, a nitride layer, an oxynitride layer, a carbide layer, a sandwich passivation including a stack of one or more of the aforementioned layers, etc.) disposed on or above the contact pad 301 and (if present) the adhesion or scratch protection layer 305 (e.g. a polyimide layer) disposed on or above the passivation layer 304 may have been etched to open the pad 301 (i.e. expose the upper surface 301a of the topmost layer 301' of the pad 301), as shown.

The pad opening etch may have also caused fluorine contamination of an upper surface 305a of the adhesion or scratch protection layer 305 (if present), as indicated in FIG. 3A by the "F"s located in layer 305.

FIG. 3B shows, in a view 320, that the contact pad 301 (for example, the exposed upper surface 301a of the topmost layer 301' of the contact pad 301) may be subjected (in other words, exposed) to a thermally activated atmosphere 321 containing water (water vapor or moisture) and/or reactive components of water (oxygen, hydrogen). In accordance with some embodiments, the thermally activated atmosphere 321 may be provided by means of a process chamber 322 (e.g. an oven), as shown. The process chamber 322 may, for example, be configured to generate and/or maintain the thermally activated atmosphere, e.g. with respect to gas composition, partial pressures of the components, temperature, etc., as described herein in connection with various embodiments (for example in connection with FIG. 1). The contact pad 301 (or the substrate 302 including the layers formed thereon, including the contact pad 301) may be placed in the process chamber 322, as shown.

The thermally activated atmosphere 321 and/or subjecting the contact pad 301 to the thermally activated atmosphere 321 may, for example, be configured or carried out in accordance with one or more embodiments described herein (e.g. in connection with FIG. 1), e.g. with respect to gas composition, partial pressures, temperature and time (temperature budget), etc.

FIG. 3C shows, in a view 340, that by means of the thermally activated atmosphere 321 the fluorine contamination "F" of the exposed part of the upper surface 301a of the topmost layer 301' of the contact pad 301 may be reduced or substantially removed (indicated by arrows 341) and a pad surface passivation layer 342 containing aluminum oxide may be formed on the exposed part of the upper surface 301a of the topmost layer 301' of the contact pad 301.

For example, water ($H_2O$) of the thermally activated atmosphere 321 may react with the fluorine contaminants at or near the upper surface 301a of the topmost layer 301' of the contact pad 301, such that aluminum oxide ($Al_2O_3$) and hydrogen fluoride (HF) may be formed. The aluminum oxide ($Al_2O_3$) may cause or contribute to the growth of a thin layer of aluminum oxide (i.e. the pad surface passivation layer 342) on the upper surface 301a of the topmost layer 301' of the contact pad 301 while the hydrogen fluoride (HF) may, for example, be exhausted from the process chamber 322.

In accordance with some embodiments, the thermally activated atmosphere 321 may contain oxygen ($O_2$). The oxygen may react with aluminum (Al) of the topmost layer 301' of the contact pad 301' (surface oxidation) and may also cause or contribute to the growth of the $Al_2O_3$ pad surface passivation layer 342. Furthermore, in accordance with some embodiments, the oxygen may also serve to remove possible organic contaminants (e.g. hydrocarbons ($C_nH_m$)) from the upper surface 301a of the topmost layer 301' of the contact pad 301, for example by means of oxidation into $CO_2$, which may, for example, be exhausted from the process chamber 322.

As indicated by arrows 343 in FIG. 3C, in case that the adhesion or scratch protection layer 305 (e.g. polyimide layer) is present it may also be subjected to the thermally activated atmosphere 321 and a possible fluorine contamination "F" at the surface 305a of the adhesion or scratch protection layer 305 may also be reduced or substantially removed by means of the thermally activated atmosphere 321. Furthermore, for example in case that the thermally activated atmosphere 321 contains oxygen ($O_2$), possible organic contaminants at the surface 305a of the adhesion or scratch protection layer 305 may also be removed from the surface 305a of the adhesion or scratch protection layer 305. In case that the adhesion or scratch protection layer 305 is not present, it may also be possible that possible halogen (e.g. fluorine) contaminations and/or organic contaminations (e.g. contamination with hydrocarbons) of the passivation layer 304 may also be reduced or substantially removed by means of the thermally activated atmosphere 321.

The exposure of the contact pad 301 to the thermally activated atmosphere 321, which leads to partial or complete removal of the fluorine surface contamination from the pad surface (and possibly also from the surfaces of other layers such as the adhesion or scratch protection layer 305 (if present)) and also to growth of the pad surface passivation layer 342, may also be referred to as pad treatment cure (PTC) process.

FIGS. 4A to 4G show schematical views illustrating a method of processing a contact pad in accordance with an embodiment. Reference signs that are the same as in FIGS. 3A to 3C denote the same or similar elements as there, and the respective elements will thus not be described in detail again here for sake of brevity. Reference is made to the description above.

FIG. 4A shows, in a view 400, that a passivation layer 304 may be formed on or above a contact pad 301. The contact pad 301 may be configured in accordance with one or more embodiments described herein. In particular, a topmost layer 301' of the contact pad 301 may contain aluminum or an aluminum alloy. In the embodiment of FIG. 4A, the contact pad 301 is shown to have only one layer 301' (which thus is the topmost layer 301' of the contact pad 301), however in accordance with other embodiments the contact pad 301 may include a layer stack including a plurality of sublayers, in which case the topmost layer 301' of the contact pad 301 corresponds to the topmost layer of the layer stack.

The contact pad 301 may, for example, be disposed on or above a substrate 302 (e.g. a silicon substrate, e.g. a silicon wafer), for example on or above an active area 411 of the substrate 302 as shown. In addition to the contact pad 301, additional contact pads (not shown) may be disposed on or above the substrate 302, e.g. on or above the active area 411 of the substrate 302, and may be configured and/or processed in a similar or the same manner as described in connection with the contact pad 301.

The passivation layer 304 may, for example, be a silicon nitride layer (alternatively e.g. a silicon oxide layer, silicon oxynitride layer, silicon carbide layer, or a sandwich passivation) and may, for example, be formed by means of a suitable deposition process such as e.g. a chemical vapor deposition (CVD) process. The passivation layer 304 may further be configured in accordance with one or more embodiments described herein.

FIG. 4B shows, in a view 410, that an adhesion or scratch protection layer 305 may be formed (e.g. by means of a suitable deposition process) on or above the passivation layer 304. In the embodiment shown, the adhesion or scratch protection layer 305 may be a photosensitive polyimide layer. Alternatively, the adhesion or scratch protection layer 305 may include or may be made of other materials. The adhesion or scratch protection layer 305 may, for example, serve to facilitate or increase adhesion to/of a chip packaging material (e.g. mold compound) and/or to protect underlying layers or elements from damages through scratching. The adhesion or scratch protection layer 305 may, for example, further be configured in accordance with one or more embodiments described herein.

Figure 4C:
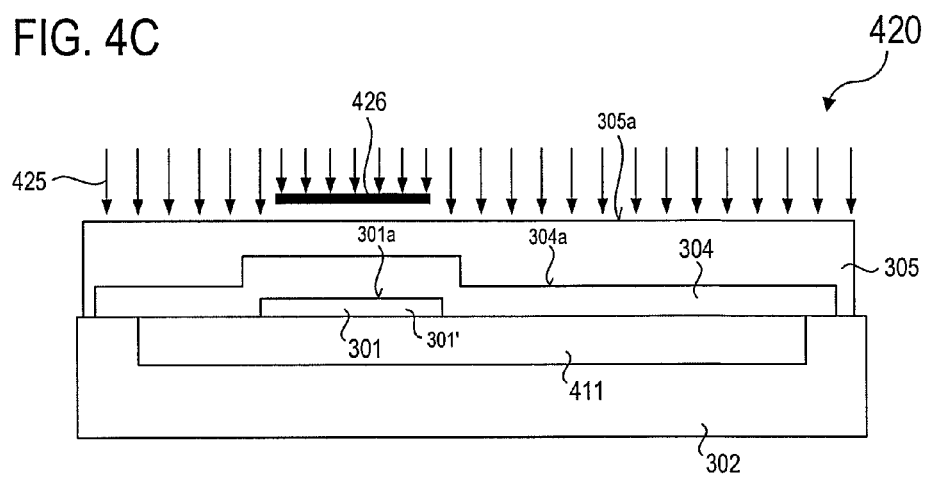
Figure 4D:
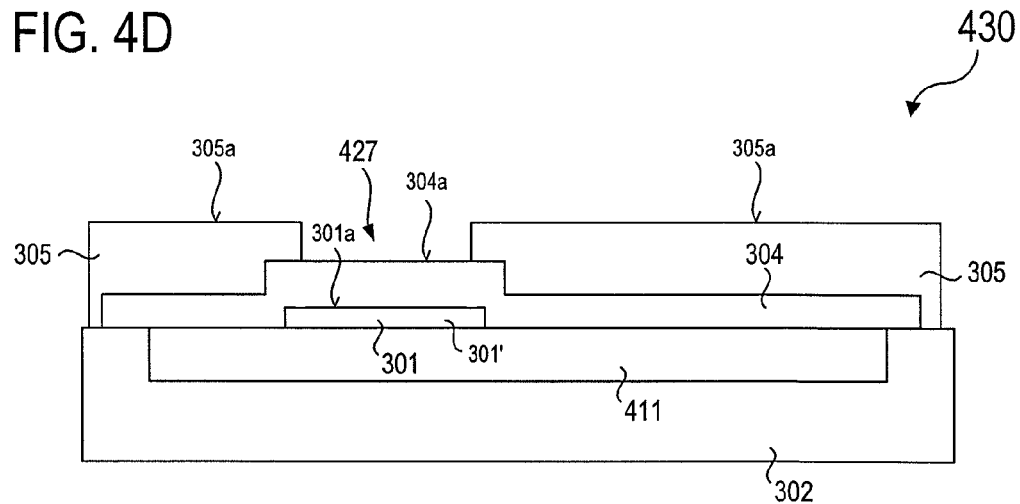

Following deposition, the adhesion or scratch protection layer 305 may be patterned, e.g. by means of lithography, as is illustrated in FIGS. 4C and 4D.

FIG. 4C shows, in a view 420, that the adhesion or scratch protection layer 305 (i.e. the photosensitive polyimide layer in accordance with the embodiment shown) may be exposed using e.g. ultraviolet (UV) light, as indicated by arrows 425 in FIG. 4C. A portion of the adhesion or scratch protection layer 305 located over the contact pad 301 may be blocked from UV exposure by means of a mask 426, as shown.

The exposed adhesion or scratch protection layer 305 may then be developed. The polyimide material of the adhesion or scratch protection layer 305 may be a negative material, such that exposed areas of the adhesion or scratch protection layer 305 may remain on the passivation layer 304 while unexposed areas of the adhesion or scratch protection layer 305 (in particular the area located over the contact pad 301 and below the mask 426) will be removed by a developer during development.

In accordance with some embodiments, the developed adhesion or scratch protection layer 305 may subsequently be cured, i.e. the adhesion or scratch protection layer 305 may be treated such that the polyimide material of the adhesion or scratch protection layer 305 will be cross-linked, thereby toughening or hardening the adhesion or scratch protection layer 305.

FIG. 4D shows, in a view 430, the contact pad 301 with the passivation layer 304 disposed thereon, and the developed and cured adhesion or scratch protection layer 305 disposed on the passivation layer 304. The adhesion or scratch protection layer 305 has an opening 427 that corresponds to the mask 326 used during the UV exposure, such that an upper surface 304a of the passivation layer 304 is exposed in a region corresponding to the contact pad 301, as shown.

Figure 4E:
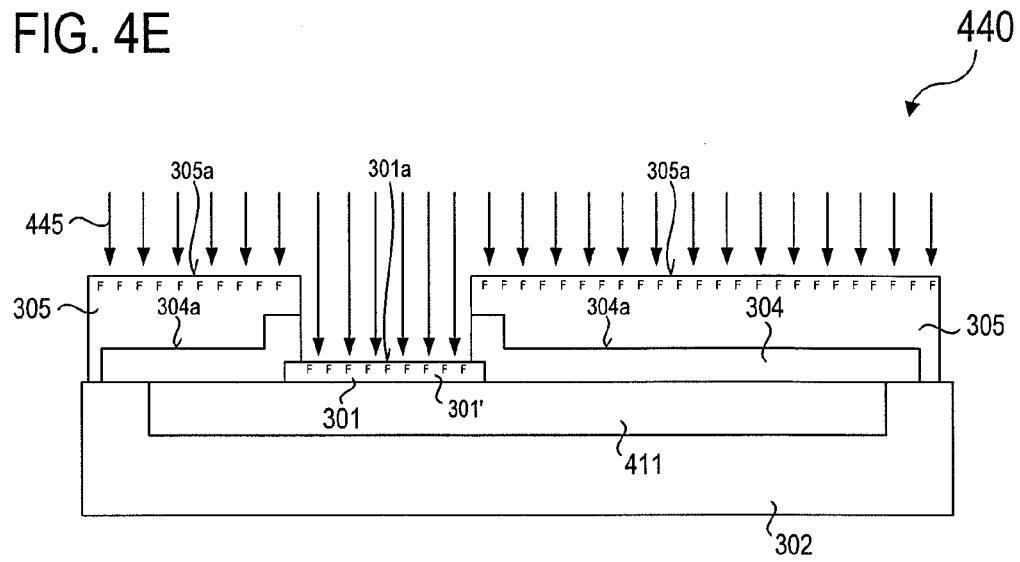

FIG. 4E shows, in a view 440, that the passivation layer 304 may be etched (indicated by arrows 445) using a fluorine-containing etchant (for example, a fluorinated etch gas such as $CF_4$, e.g. $CF_4$ plasma), such that at least a part of an upper surface 301a of the topmost layer 301' of the contact pad 301 is exposed (so-called pad opening etch). In the embodiment shown, the patterned adhesion or scratch protection layer 305 (polyimide layer) may be used as an etch mask.

The etching 445 of the passivation layer 304 may cause fluorine contamination of the exposed part of the upper surface 301a of the topmost layer 301' of the contact pad 301 (as is schematically illustrated by the "F"s located in layer 301'). Furthermore, in accordance with the embodiment shown, the etching 445 may also cause fluorine contamination of the exposed upper surface 305a of the patterned adhesion or scratch protection layer 305 (polyimide layer).

Figure 4F:
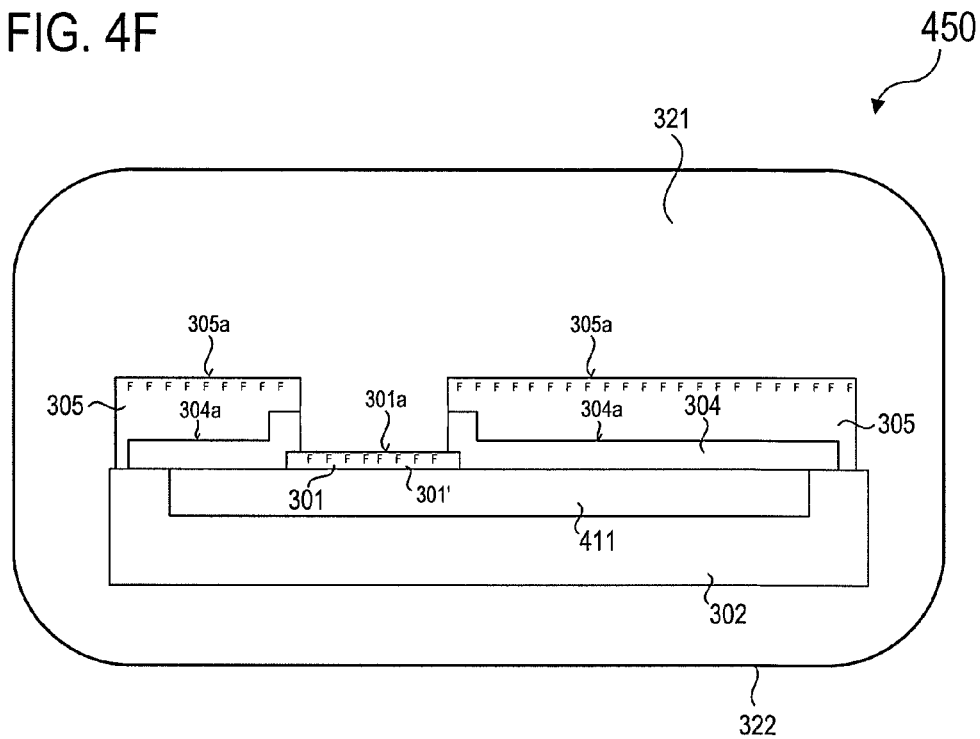
Figure 4G:
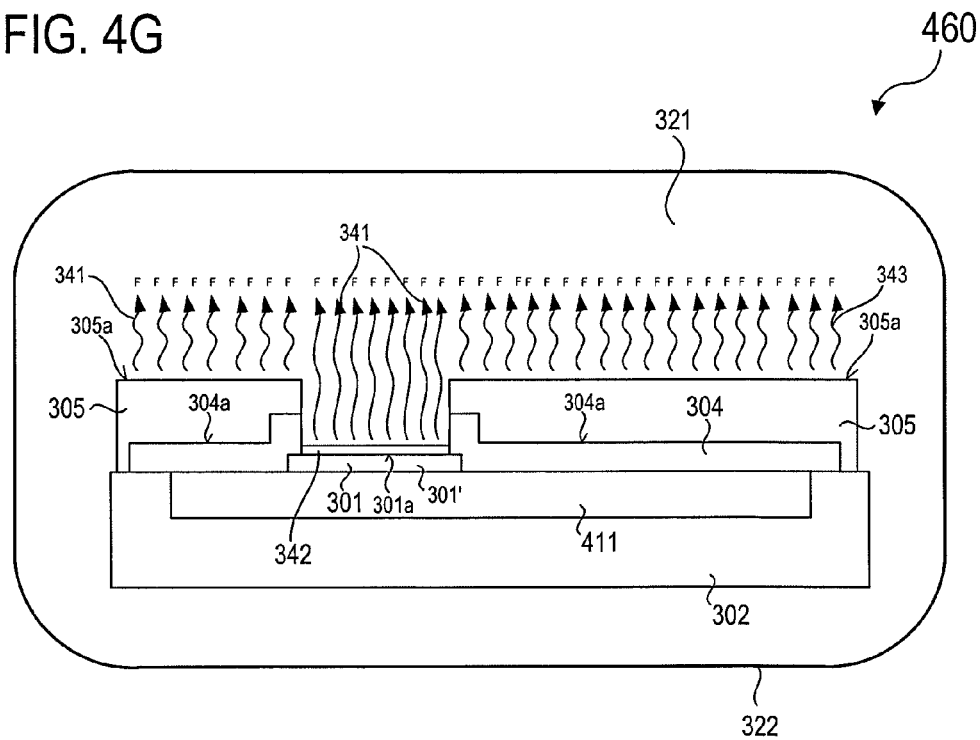

Subsequently, for example directly after the pad opening etch 445 in accordance with some embodiments, a pad treatment cure (PTC) process may be applied to the contact pad 301, in which the exposed part of the upper surface 301 a of the topmost layer 301' of the contact pad 301 and, in accordance with the embodiment shown, the exposed upper surface 305a of the patterned adhesion or scratch protection layer 305 (polyimide layer) may be subjected to a thermally activated atmosphere 321 containing water or reactive components of water such that the fluorine contamination "F" of the exposed part of the upper surface 301a of the topmost layer 301' of the contact pad 301 and, in accordance with this embodiment, also of the upper surface 305a of the adhesion or scratch protection layer 305 is reduced and a pad surface passivation layer 342 containing aluminum oxide is formed on the exposed part of the upper surface 301a of the topmost layer 301' of the contact pad 301, as shown in FIGS. 4F and 4G.

FIG. 4F shows, in a view 450, that the fluorine-contaminated pad surface (i.e. the exposed part of the upper surface 301a of the topmost layer 301' of the contact pad 301) and the fluorine-contaminated upper surface 305a of the adhesion or scratch protection layer 305 are subjected to a thermally activated atmosphere 321 containing water or reactive components of water.

This may be effected, for example, by means of a process chamber 322 that may be configured to provide the thermally activated atmosphere 321. To this end, the substrate 302 including the layers formed thereon (including the contact pad 301, the passivation layer 304 and the adhesion or scratch protection layer 305, and possibly additional layers not shown in the figure) may be placed in the process chamber 322. The process chamber 322 may, for example, be configured in accordance with one or more embodiments described herein. Furthermore, process conditions of the PTC process (e.g. gas composition of the thermally activated atmosphere, partial pressures of the components, temperature budget) may, for example, be chosen in accordance with one or more embodiments described herein.

FIG. 4G shows, in a view 460, that evaporation of fluorine (e.g. in the form of hydrogen fluoride (HF)) from the contact pad 301 (indicated by arrows 341) and also from the adhesion or scratch protection layer 305 occurs during the PTC process. Thus, the fluorine contamination level of both the contact pad 301 and the adhesion or protection layer 305 may be significantly reduced. In addition, a stable pad surface passivation layer 342 containing aluminum oxide may be formed on the contact pad 301, as shown.

In accordance with the embodiment described above in connection with FIGS. 4A to 4G, an adhesion or scratch protection layer such as a polyimide layer may be deposited and cured before a passivation etch (pad opening etch) is carried out. Curing the polyimide layer before the passivation etch may, for example, have the effect that the polyimide layer will be more resistant against the etch chemistry (e.g. $CF_4$ plasma or the like) used in the subsequent passivation etch so that surface properties such as e.g. surface roughness of the polyimide layer will be less or not affected by the passivation etch. Thus, a polyimide layer with lower surface roughness may be obtained (see e.g. FIG. 8), for example compared to a process, where curing of the polyimide layer is carried out only after the passivation etch. A polyimide layer with lower surface roughness may, for example, have the effect that potential residues after demounting of any protection layer of post processes (e.g. potential glue residues after demounting of a foil used in a wafer thinning process) may be avoided.

It has to be noted that, in accordance with some embodiments and unlike the embodiment described above in connection with FIGS. 4A to 4G, formation of an adhesion or scratch protection layer (e.g. polyimide layer) may alternatively be carried out after the PTC process, i.e. after subjecting the contact pad to the thermally activated atmosphere. In this case, etching of the passivation layer (i.e. pad opening) may, for example, be carried out using a photoresist as a mask (instead of the patterned adhesion or scratch protection layer).

Figure 5:
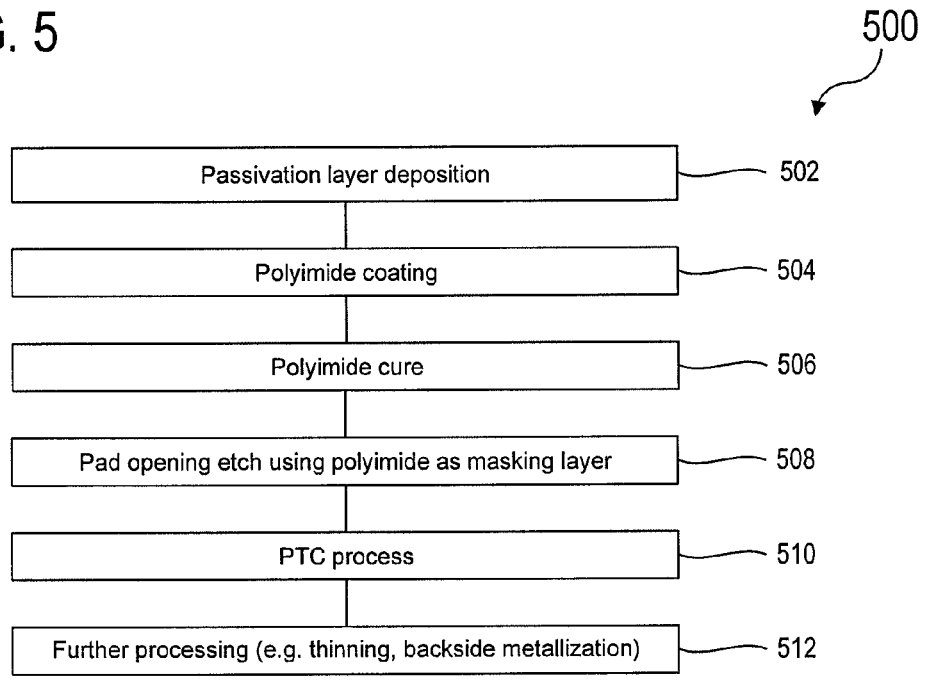
FIG. 5 shows a diagram illustrating an example process flow including a pad treatment cure (PTC) process in accordance with an embodiment.

FIG. 5 shows a diagram 500 illustrating an example process flow including a pad treatment cure (PTC) process in accordance with an embodiment. The process flow may include deposition and curing of a polyimide layer before carrying out a pad opening etch, as shown.

In 502, a passivation layer (e.g. nitride, oxide, carbide, sandwich passivation, etc.) may be deposited on or above at least one contact pad (and possibly on or above exposed areas of a substrate (e.g. wafer), on or above which the contact pad(s) may be disposed, in accordance with some embodiments), a topmost layer of the at least one contact pad containing aluminum or an aluminum alloy.

In 504, a polyimide layer may be coated on the passivation layer. The polyimide layer may serve as an adhesion or scratch protection layer and/or as a (second) passivation layer. The polyimide layer may be patterned to expose a portion of the passivation layer located above the contact pad. Patterning of the polyimide layer may, for example, include exposure of the polyimide layer to light (e.g. UV exposure) and development of the exposed polyimide layer.

In 506, the polyimide layer may be cured (e.g. by means of UV radiation, alternatively using other suitable curing techniques).

In 508, a pad opening etch may be carried out using the polyimide layer as masking layer, such that the pad surface of the contact pad may be at least partially exposed. The etching may cause halogen contamination (e.g. fluorine contamination) of the exposed pad surface of the contact pad (and possibly also of the exposed surface of the polyimide layer) due to the etch chemistry used for the etching, as described herein in connection with various embodiments.

In 510, a PTC process may be applied to the contact pad. In other words, the exposed pad surface of the contact pad and the exposed surface of the polyimide layer may be subjected to a thermally activated atmosphere containing water or reactive components of water, as described herein in connection with various embodiments. By means of the PTC process, the halogen contamination of the contact pad (and also of the polyimide layer) may be reduced or substantially removed and a stable pad surface passivation layer containing aluminum oxide may be formed on the contact pad, as described herein in connection with various embodiments.

In 512, the process flow may continue with further processing steps such as, for example, thinning (e.g. wafer thinning), backside metallization, etc.

Figure 6:
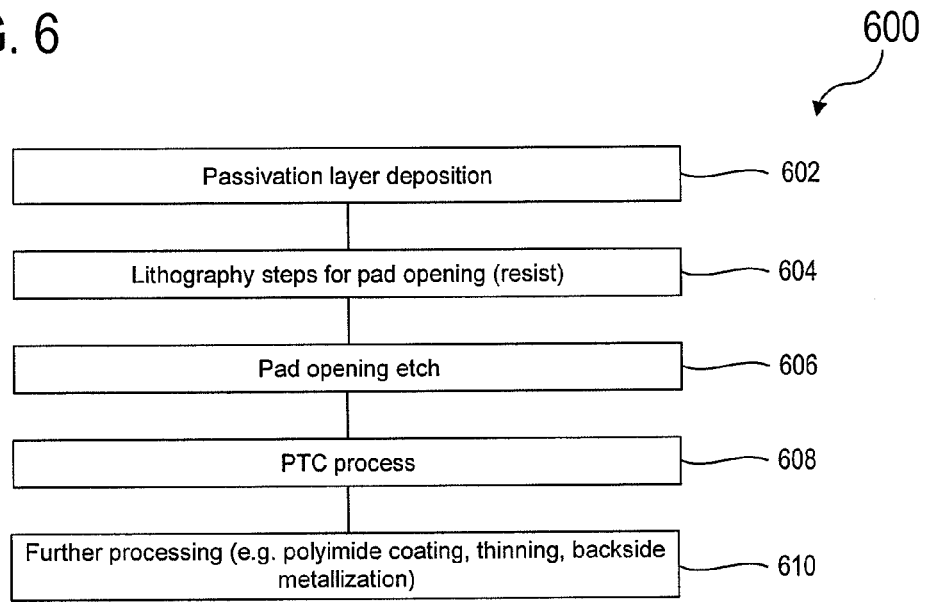
FIG. 6 shows a diagram illustrating an example process flow including a pad treatment cure (PTC) process in accordance with an embodiment.

FIG. 6 shows a diagram 600 illustrating an example process flow including a pad treatment cure (PTC) process in accordance with another embodiment. The process flow may include a pad opening process using photoresist, while a polyimide layer may be deposited only after the PTC process in accordance with some embodiments, as shown.

In 602, a passivation layer (e.g. nitride, oxide, carbide, sandwich passivation, etc.) may be deposited on or above at least one contact pad (and possibly on or above exposed areas of a substrate (e.g. wafer), on or above which the contact pad(s) may be disposed, in accordance with some embodiments), a topmost layer of the at least one contact pad containing aluminum or an aluminum alloy.

In 604, one or more lithography steps for a pad opening may be carried out using a photoresist. In other words, a photoresist layer may be deposited on or above the passivation layer and may be patterned by means of lithography to expose a portion of the passivation layer located above the contact pad.

In 606, a pad opening etch may be carried out using the patterned photoresist as masking layer, such that the pad surface of the contact pad may be at least partially exposed. The etching may cause halogen contamination (e.g. fluorine contamination) of the exposed pad surface of the contact pad (and possibly also of the exposed surface of the polyimide layer) due to the etch chemistry used for the etching, as described herein in connection with various embodiments.

In 608, a PTC process may be applied to the contact pad. In other words, the exposed pad surface of the contact pad and the exposed surface of the polyimide layer may be subjected to a thermally activated atmosphere containing water or reactive components of water, as described herein in connection with various embodiments. By means of the PTC process, the halogen contamination of the contact pad (and also of the polyimide layer) may be reduced or substantially removed and a stable pad surface passivation layer containing aluminum oxide may be formed on the contact pad, as described herein in connection with various embodiments.

In 610, the process flow may continue with further processing steps such as, for example, polyimide coating, thinning (e.g. wafer thinning), backside metallization, etc.

In the following, exemplary features and potential effects of exemplary embodiments described herein are discussed.

Various embodiments may provide effective pad treatment processes or pad conditioning processes for pads having an aluminum or aluminum-containing pad surface, to provide defined pad surfaces that may, for example, be insensitive to corrosion by environmental conditions and suitable for further processing such as e.g. wafer thinning, backside metallization, wire bonding, wedge bonding, or other processing steps or stages.

Various embodiments may provide pad conditioning processes that may avoid discolored, especially halogen (in particular, fluorine) contaminated bond pad surfaces. Thus, various non-conformances such as optical discolorations, non-stick on pad deviations, weak bond shear test results or potentially degraded electrical contact resistance properties, may be avoided.

As an example, FIG. 7 shows a photograph of a contact pad 700 that has been subjected to a pad treatment cure (PTC) process in accordance with an embodiment. As can be seen (e.g. in comparison to the contact pad 900 of FIG. 9), the contact pad 700 does not exhibit discoloration.

Furthermore, pad metallizations with defined aluminum oxide thickness and less halogen contamination (e.g. less fluorine contamination) may be obtained in accordance with various embodiments.

In accordance with various embodiments, adhesion or scratch protection layer (e.g. polyimide layer) surfaces with low, reproduceable roughness, defined chemical properties, and less halogen contamination (e.g. less fluorine contamination) may be obtained that may, for example, have sufficient adhesion to chip packaging material (e.g. mold compound).

As an example, FIG. 8 shows two SEM micrographs 800 and 820 of the surface of a polyimide layer obtained after a PTC process in accordance with an embodiment, a first micrograph 800 having a magnification factor of 30,000 and a second micrograph 820 having a magnification factor of 150,000. As may be seen by comparison with the micrographs of FIG. 10, the surface roughness of the polyimide layer shown in FIG. 8 (obtained after the PTC process) may be significantly lower than that of the polyimide layer shown in FIG. 10 (obtained after the Ar/O₂ pad treatment process).

Various embodiments may provide a pad treatment cure (PTC) process that may evaporate or distribute a halogen contamination (e.g. fluorine contamination) of the pad surface and may, at the same time, provide a homogeneous aluminum oxide ($Al_2O_3$) layer on the pad metallization, which may serve as a passivation of the pad surface. The contamination (e.g. fluorine contamination) of the pad surface (and possibly also of the surfaces of other layers such as, for example, an adhesion or scratch protection layer (e.g. polyimide layer)) may have been caused by an overetching step during a pad opening etch (using, for example, a fluorinated etch gas, e.g. a $CF_4$ plasma or the like). It has to be noted that different etching processes may leave different (e.g. fluorine) contamination levels on the pad metallization surface.

In accordance with various embodiments, the pad treatment cure (PTC) process may be carried out directly after a pad opening etch, which may be the main contributor of halogen (e.g. fluorine) contamination on pads.

In accordance with various embodiments, the PTC process may include a thermal cure process in a thermally activated atmosphere containing water ($H_2O$) and, in some embodiments, oxygen ($O_2$), which may be easily controllable by process parameters such as e.g. partial pressures of $H_2O$ and $O_2$ and the temperature profile using, for example, a semiconductor standard oven equipment.

In accordance with various embodiments, fluorine contaminants at the pad surface may react with moisture (i.e. water ($H_2O$)) of the thermally activated atmosphere, thereby forming aluminum oxide ($Al_2O_3$) and hydrogen fluoride (HF), following e.g. the chemical equations:

$$2Al[AlF_6]+6H_2O \rightarrow 2Al_2O_3+12HF;$$

$$2AlF_3+3H_2O \rightarrow Al_2O_3+6HF.$$

Thus, any fluorine may be removed or substantially removed by forming the gaseous HF compound, and formation of a ($Al_2O_3$) pad surface passivation layer may be achieved or supported.

In accordance with various embodiments, the thermally activated atmosphere may contain oxygen as a gas ($O_2$), which may lead to aluminum surface oxidation, thereby achieving or adding to the formation of the ($Al_2O_3$) pad surface passivation layer, following e.g. the chemical equation:

$$4Al+3O_2 \rightarrow 2Al_2O_3.$$

Thus, in case the thermally activated atmosphere contains water ($H_2O$) and oxygen ($O_2$), both the water and the oxygen may contribute to the formation of the ($Al_2O_3$) pad surface passivation layer such that growth of the passivation layer may be increased or accelerated.

The above-described reactions may take place at the interface of the metallic aluminum and the already grown aluminum oxide. That is, the oxygen used in the reaction may need to diffuse through the already formed $Al_2O_3$ layer. In this connection, using $H_2O$ as oxygen carrier may lead to faster diffusion and reaction as it is known that $H_2O$ may diffuse faster than the bigger $O_2$ molecule.

Thus, in accordance with various embodiments, the formation of a halogen free (e.g. fluorine free) and reproducible defined $Al_2O_3$ pad surface passivation layer may be achieved by moisture oxidation during the PTC process.

In accordance with various embodiments, organic contaminations (e.g. contamination with hydrocarbons ($C_nH_m$)) of the pad surface (which may also have been caused by the passivation etching) may be removed by the PTC process as well, e.g. by oxidation into $CO_2$ (carbon dioxide), following e.g. the chemical equation:

$$C_nH_m+(n+m/4)O_2 \rightarrow nCO_2+m/2H_2O.$$

The carbon dioxide may, for example, be exhausted.

Effects of a PTC process in accordance with various embodiments described herein may include:

- an effective and reproducible reduction of a fluorine contamination of the pad surface may be achieved; for example, AES (Auger electron spectroscopy) and EDX (energy-dispersive X-ray spectroscopy) experiments indicate that by means of a PTC process as described herein a fluorine contamination of the pad surface that is present directly after a pad opening etch may, for example, be reduced by at least 50%, for example by at least 75% in accordance with some embodiments, for example by at least 80% in accordance with some embodiments.

- formation of an aluminum oxide layer (as a pad surface passivation) with a defined, uniform and reproducible thickness in the nanometer range (e.g. a thickness of about 5 nm in accordance with an embodiment) may be achieved; the aluminum oxide layer may serve as an effective bather against attack from various chemicals during post processes and environment (e.g. moisture, cooling liquids from wafer sawing processes and similar media or gases); furthermore, the pad surface with the aluminium oxide passivation may be stable against pad corrosion, for example F-induced corrosion and/or pitting corrosion (e.g. Cu-pitting) may be reduced or avoided; thus, in summary, a stable pad passivation may be formed in accordance with various embodiments;

- some passivation surface properties of an adhesion or scratch protection layer (for example an imide layer, e.g. polyimide layer) such as, for example, surface roughness or layer thickness may be unchanged (in other words, unaffected by the PTC process), while other passivation surface properties of the adhesion or scratch protection layer such as, for example, adhesion to a mold compound may be improved (due to the reduced F contamination); for example compared to e.g. an Ar/O₂ pad treatment process, a more efficient reduction of fluorine may be achieved while at the same time the surface roughness of an imide layer (e.g. polyimide layer) may remain unchanged; in other words, an increase of the surface roughness of the imide layer may be avoided (as shown, for example, in FIG. 8); a low surface roughness of the imide layer may, for example, have the effect that residues after demounting of any protection layer of post processes (e.g. glue residues after demounting of a foil used in a wafer thinning process) may be avoided;

in accordance with some embodiments, curing of an imide layer may be carried out before passivation etching; this may have the effect that an imide color change may be avoided;

the process may be configured as a batch process (for example, wet oven batch process), which may be cost effective.

A method of processing a contact pad in accordance with various embodiments may include: providing a contact pad, a topmost layer of the contact pad containing aluminum or an aluminum alloy, at least part of the topmost layer of the contact pad being exposed; subjecting the contact pad to a thermally activated atmosphere containing water or reactive components of water.

In various embodiments, a pad surface passivation layer may be formed on the exposed part of the topmost layer of the contact pad by means of subjecting the contact pad to the thermally activated atmosphere.

In various embodiments, the exposed part of the topmost layer of the contact pad may have a halogen contamination, and the halogen contamination of the exposed part of the topmost layer of the contact pad may be reduced by means of subjecting the contact pad to the thermally activated atmosphere.

In various embodiments, the halogen contamination may include or may be a fluorine contamination.

In various embodiments, the pad surface passivation layer may contain aluminum oxide.

In various embodiments, the thermally activated atmosphere may contain water. The water may have a partial pressure greater than zero and less than the critical pressure of water, for example a partial pressure of about 50 mbar in accordance with one embodiment, for example in (but not restricted to) embodiments where the thermally activated atmosphere has atmospheric pressure (i.e. a pressure of about 1013 mbar); other values of the partial pressure may be possible in accordance with other embodiments.

In various embodiments, the thermally activated atmosphere may further contain oxygen.

In various embodiments, the oxygen may have a partial pressure greater than zero and less than or equal to about 1000 mbar, e.g. greater than zero and less than or equal to about 993 mbar, for example in (but not restricted to) embodiments where the thermally activated atmosphere has atmospheric pressure (i.e. a pressure of about 1013 mbar); other values of the partial pressure may be possible in accordance with other embodiments.

In various embodiments, the thermally activated atmosphere may contain hydrogen and oxygen. The hydrogen may, for example, have a partial pressure greater than zero and less than or equal to about 1000 mbar, e.g. greater than zero and less than or equal to about 993 mbar and the oxygen may, for example, have a partial pressure greater than zero and less than about 1000 mbar, e.g. greater than zero and less than or equal to about 993 mbar, for example in (but not restricted to) embodiments where the thermally activated atmosphere has atmospheric pressure (i.e. a pressure of about 1013 mbar); other values of the partial pressures may be possible in accordance with other embodiments.

In various embodiments, a temperature of the thermally activated atmosphere may be in the range from about 50° C. to about 500° C. Other values of the temperature may be possible in accordance with other embodiments.

In various embodiments, subjecting the contact pad to the thermally activated atmosphere may be carried out for a time period in the range from about 5 seconds to about 5 days. Other values of the time period may be possible in accordance with other embodiments.

In various embodiments, subjecting the contact pad to the thermally activated atmosphere may be carried out in a process chamber.

In various embodiments, the thermally activated atmosphere may contain a plasma.

In various embodiments, the topmost layer of the contact pad may have a contamination with organic contaminants (e.g. hydrocarbons), and the contamination of the topmost layer of the contact pad with organic contaminants may be reduced by means of subjecting the contact pad to the thermally activated atmosphere.

In various embodiments, providing the contact pad may include: forming a contact pad layer or layer stack on or above a substrate, the contact pad layer or layer stack including at least the topmost layer of the contact pad containing aluminum or an aluminum alloy; forming a passivation layer on or above the contact pad layer or layer stack; etching the passivation layer using at least one halogen-containing etchant, such that at least part of the topmost layer of the contact pad is exposed, wherein the etching causes the halogen contamination of the exposed part of the topmost layer of the contact pad.

In various embodiments, the passivation layer may contain at least one of the following materials: an oxide material; a nitride material; an oxynitride material; a carbide material; amorphous hydrogenated carbon; $Al_xO_y$; a metal.

In various embodiments, etching the passivation layer may be effected using a plasma etch process.

In various embodiments, the at least one halogen-containing etchant may include a fluorine-containing etchant, and the halogen contamination of the exposed part of the topmost layer of the contact pad may include or may be a fluorine contamination.

In various embodiments, the fluorine-containing etchant may include a fluorinated etch gas.

In various embodiments, subjecting the contact pad to the thermally activated atmosphere may be effected in a processing step that directly follows etching the passivation layer.

In various embodiments, before etching the passivation layer, an adhesion or scratch protection layer may be formed on or above the passivation layer and may be patterned such that at least a part of the passivation layer located on or above the contact pad is exposed, and etching the passivation layer may include etching the exposed part of the passivation layer.

In various embodiments, etching the passivation layer may further cause halogen contamination of an exposed part of the adhesion or scratch protection layer and the exposed part of the adhesion or scratch protection layer may be subjected to the thermally activated atmosphere such that the halogen contamination of the exposed part of the adhesion or scratch protection layer may be reduced by the thermally activated atmosphere.

In various embodiments, the adhesion or scratch protection layer may contain an imide material.

In various embodiments, the patterned adhesion or scratch protection layer may be cured before etching the passivation layer.

In various embodiments, etching the passivation layer may further cause contamination of at least one of the exposed part of the topmost layer of the contact pad and the exposed part of the adhesion or scratch protection layer with organic contaminants, and the contamination with organic contaminants may be reduced by the thermally activated atmosphere.

A method of processing a contact pad in accordance with various embodiments may include: providing a contact pad, a topmost layer of the contact pad containing aluminum or an aluminum alloy, at least part of the topmost layer of the contact pad being exposed and having a halogen contamination; subjecting the contact pad to a thermally activated atmosphere containing water or reactive components of water, such that the halogen contamination of the exposed part of the topmost layer of the contact pad is reduced and a pad surface passivation layer is formed on the exposed part of the topmost layer of the contact pad.

In various embodiments, providing the contact pad may include: forming a contact pad layer or layer stack on or above a substrate, the contact pad layer or layer stack including at least the topmost layer of the contact pad comprising aluminum or an aluminum alloy; forming a passivation layer on or above the contact pad layer or layer stack; etching the passivation layer using at least one halogen-containing etchant, such that at least part of the topmost layer of the contact pad is exposed, wherein the etching causes the halogen contamination of the exposed part of the topmost layer of the contact pad.

In various embodiments, the topmost layer of the contact pad may further have a contamination with organic contaminants, and the contamination of the topmost layer of the contact pad with organic contaminants may be reduced by means of subjecting the contact pad to the thermally activated atmosphere.

A method of processing a contact pad in accordance with various embodiments may include: forming a passivation layer on or above a contact pad, a topmost layer o f the contact pad containing aluminum or an aluminum alloy; etching the passivation layer using a fluorine-containing etchant, such that at least a part of an upper surface of the topmost layer of the contact pad is exposed, wherein the etching causes fluorine contamination of the exposed part of the upper surface of the topmost layer of the contact pad; subjecting the contact pad to a thermally activated atmosphere containing water or reactive components of water, such that the fluorine contamination of the exposed part of the upper surface of the topmost layer of the contact pad is reduced and a pad surface passivation layer containing aluminum oxide is formed on the exposed part of the upper surface of the topmost layer of the contact pad.

In various embodiments, the thermally activated atmosphere may contain water and oxygen.

In various embodiments, a temperature of the thermally activated atmosphere may be in the range from about 50° C. to about 500° C. Other values of the temperature may be possible in accordance with other embodiments.

In various embodiments, etching the passivation layer may include a plasma etch process using a fluorinated etch gas.

In various embodiments, before etching the passivation layer, an adhesion or scratch protection layer may be formed on or above the passivation layer and may be patterned such that at least a part of the passivation layer located on or above the contact pad is exposed; wherein etching the passivation layer may include etching the exposed part of the passivation layer.

In various embodiments, the patterned adhesion or scratch protection layer may be cured before etching the passivation layer.

In various embodiments, the adhesion or scratch protection layer may contain an imide material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of processing a contact pad, the method comprising:
   providing a contact pad, a topmost layer of the contact pad comprising aluminum or an aluminum alloy, at least part of the topmost layer of the contact pad being exposed;
   subjecting the contact pad to a thermally activated atmosphere comprising water or reactive components of water.

2. The method of claim 1, wherein a pad surface passivation layer is formed on the exposed part of the topmost layer of the contact pad by means of subjecting the contact pad to the thermally activated atmosphere.

3. The method of claim 2, wherein the pad surface passivation layer comprises aluminum oxide.

4. The method of claim 1, wherein the exposed part of the topmost layer of the contact pad comprises a halogen contamination, and wherein the halogen contamination of the exposed part is reduced by means of subjecting the contact pad to the thermally activated atmosphere.

5. The method of claim 4, wherein the halogen contamination comprises a fluorine contamination.

6. The method of claim 4, wherein providing the contact pad comprises:
   forming a contact pad layer or layer stack on or above a substrate, the contact pad layer or layer stack comprising at least the topmost layer of the contact pad comprising aluminum or an aluminum alloy;
   forming a passivation layer on or above the contact pad layer or layer stack;
   etching the passivation layer using at least one halogen-containing etchant, such that at least part of the topmost layer of the contact pad is exposed, wherein the etching causes the halogen contamination of the exposed part of the topmost layer of the contact pad.

7. The method of claim 6, wherein the passivation layer comprises at least one of the following materials:
   an oxide material;
   a nitride material;
   an oxynitride material;
   a carbide material;
   amorphous hydrogenated carbon;
   $Al_xO_y$;
   a metal.

8. The method of claim 6, wherein etching the passivation layer is effected using a plasma etch process.

9. The method of claim 6, wherein the at least one halogen-containing etchant comprises a fluorine-containing etchant, and wherein the halogen contamination of the exposed part of the topmost layer of the contact pad comprises a fluorine contamination.

10. The method of claim 9, wherein the fluorine-containing etchant comprises a fluorinated etch gas.

11. The method of claim 6, wherein subjecting the contact pad to the thermally activated atmosphere is effected in a processing step that directly follows etching the passivation layer.

12. The method of claim 6, further comprising:
   before etching the passivation layer, forming an adhesion or scratch protection layer on or above the passivation layer and patterning the adhesion or scratch protection layer such that at least a part of the passivation layer located on or above the contact pad is exposed;
wherein etching the passivation layer comprises etching the exposed part of the passivation layer.

13. The method of claim 12, wherein etching the passivation layer further causes a halogen contamination of an exposed part of the adhesion or scratch protection layer and wherein the exposed part of the adhesion or scratch protection layer is subjected to the thermally activated atmosphere such that the halogen contamination of the exposed part of the adhesion or scratch protection layer is reduced by the thermally activated atmosphere.

14. The method of claim 13, wherein etching the passivation layer further causes contamination of at least one of the exposed part of the topmost layer of the contact pad and the exposed part of the adhesion or scratch protection layer with organic contaminants, and wherein the contamination with organic contaminants is reduced by the thermally activated atmosphere.

15. The method of claim 12, wherein the adhesion or scratch protection layer comprises an imide material.

16. The method of claim 12, further comprising:
curing the patterned adhesion or scratch protection layer before etching the passivation layer.

17. The method of claim 1, wherein the thermally activated atmosphere comprises water.

18. The method of claim 3, wherein the water has a partial pressure greater than zero and less than the critical pressure of water.

19. The method of claim 17, wherein the thermally activated atmosphere further comprises oxygen.

20. The method of claim 19, wherein the oxygen has a partial pressure greater than zero and less than or equal to about 993 mbar.

21. The method of claim 1, wherein the thermally activated atmosphere comprises hydrogen and oxygen.

22. The method of claim 21, wherein the hydrogen has a partial pressure greater than zero and less than or equal to about 993 mbar and the oxygen has a partial pressure greater than zero and less than or equal to about 993 mbar.

23. The method of claim 21, wherein subjecting the contact pad to the thermally activated atmosphere is carried out for a time period in the range from about 5 seconds to about 5 days.

24. The method of claim 1, wherein a temperature of the thermally activated atmosphere is in the range from about 50° C. to about 500° C.

25. The method of claim 1, wherein subjecting the contact pad to the thermally activated atmosphere is carried out in a process chamber.

26. The method of claim 1, wherein the thermally activated atmosphere comprises a plasma.

27. The method of claim 1, wherein the topmost layer of the contact pad comprises a contamination with organic contaminants, and wherein the contamination of the topmost layer of the contact pad with organic contaminants is reduced by means of subjecting the contact pad to the thermally activated atmosphere.

28. A method of processing a contact pad, the method comprising:
providing a contact pad, a topmost layer of the contact pad comprising aluminum or an aluminum alloy, at least part of the topmost layer of the contact pad being exposed and comprising a halogen contamination;
subjecting the contact pad to a thermally activated atmosphere comprising water or reactive components of water, such that the halogen contamination of the exposed part of the topmost layer of the contact pad is reduced and a pad surface passivation layer is formed on the exposed part of the topmost layer of the contact pad.

29. The method of claim 28, wherein providing the contact pad comprises:
forming a contact pad layer or layer stack on or above a substrate, the contact pad layer or layer stack comprising at least the topmost layer of the contact pad comprising aluminum or an aluminum alloy;
forming a passivation layer on or above the contact pad layer or layer stack;
etching the passivation layer using at least one halogen-containing etchant, such that at least part of the topmost layer of the contact pad is exposed, wherein the etching causes the halogen contamination of the exposed part of the topmost layer of the contact pad.

30. The method of claim 29, wherein the topmost layer of the contact pad further comprises a contamination with organic contaminants, and wherein the contamination of the topmost layer of the contact pad with organic contaminants is reduced by means of subjecting the contact pad to the thermally activated atmosphere.

31. A method of processing a contact pad, the method comprising:
forming a passivation layer on or above a contact pad, a topmost layer of the contact pad comprising aluminum or an aluminum alloy;
etching the passivation layer using a fluorine-containing etchant, such that at least a part of an upper surface of the topmost layer of the contact pad is exposed, wherein the etching causes fluorine contamination of the exposed part of the upper surface of the topmost layer o f the contact pad;
subjecting the contact pad to a thermally activated atmosphere comprising water or reactive components of water, such that the fluorine contamination of the exposed part of the upper surface of the topmost layer of the contact pad is reduced and a pad surface passivation layer comprising aluminum oxide is formed on the exposed part of the upper surface of the topmost layer of the contact pad.

32. The method of claim 31, wherein the thermally activated atmosphere comprises water and oxygen.

33. The method of claim 31, wherein a temperature of the thermally activated atmosphere is in the range from about 50° C. to about 500° C.

34. The method of claim 31, wherein etching the passivation layer comprises a plasma etch process using a fluorinated etch gas.

35. The method of claim 31, further comprising:
before etching the passivation layer, forming an adhesion or scratch protection layer on or above the passivation layer, patterning the adhesion or scratch protection layer such that at least a part of the passivation layer located on or above the contact pad is exposed;
wherein etching the passivation layer comprises etching the exposed part of the passivation layer.

36. The method of claim 35, further comprising:
curing the patterned adhesion or scratch protection layer before etching the passivation layer.

37. The method of claim 35, wherein the adhesion or scratch protection layer comprises an imide material.

* * * * *